United States Patent
Saito

(10) Patent No.: US 7,532,504 B2
(45) Date of Patent: May 12, 2009

(54) SPIN INJECTION MAGNETIC DOMAIN WALL DISPLACEMENT DEVICE AND ELEMENT THEREOF

(75) Inventor: Akira Saito, Yokosuka (JP)

(73) Assignee: Fuji Electric Holdings Co., Ltd. (JP)

( * ) Notice: Subject to any disclaimer, the term of this patent is extended or adjusted under 35 U.S.C. 154(b) by 560 days.

(21) Appl. No.: 11/379,474

(22) Filed: Apr. 20, 2006

(65) Prior Publication Data

US 2006/0237808 A1 Oct. 26, 2006

(30) Foreign Application Priority Data

Apr. 20, 2005 (JP) ............... 2005-122223

(51) Int. Cl.
*G11C 11/14* (2006.01)
*G11C 11/15* (2006.01)
*H01L 43/02* (2006.01)

(52) U.S. Cl. ............... 365/158; 365/171; 365/173; 257/421

(58) Field of Classification Search ............... 365/158, 365/171, 173; 257/421
See application file for complete search history.

(56) References Cited

U.S. PATENT DOCUMENTS

| | | | | |
|---|---|---|---|---|
| 5,475,304 | A * | 12/1995 | Prinz .................. | 324/207.21 |
| 6,074,707 | A | 6/2000 | Nakazawa et al. | |
| 6,249,453 | B1 | 6/2001 | You et al. | |
| 6,600,638 | B2 | 7/2003 | Gill | |
| 6,903,400 | B2 | 6/2005 | Kikuchi et al. | |
| 6,956,257 | B2 * | 10/2005 | Zhu et al. ............. | 257/295 |
| 7,242,604 | B2 * | 7/2007 | Klaeui et al. ........... | 365/145 |
| 2003/0085413 | A1 * | 5/2003 | Wunderlich .......... | 257/200 |
| 2004/0145850 | A1 | 7/2004 | Fukumoto et al. | |

(Continued)

FOREIGN PATENT DOCUMENTS

JP 2004-207707 A 7/2004

(Continued)

OTHER PUBLICATIONS

Related co-pending U.S. Appl. No. 11/475,835; Akira Saito; "Spin Injection Magnetization Reversal Element"; filed Jun. 27, 2006.

(Continued)

*Primary Examiner*—Evan Pert
(74) *Attorney, Agent, or Firm*—Rossi, Kimms & McDowell LLP

(57) ABSTRACT

A spin injection magnetic domain wall displacement device has a plurality of spin injection magnetic domain wall displacement elements. Each element includes a magnetic domain wall displacement layer having a magnetic domain wall, and a first, second, and third magnetic layer groups each having a ferromagnetic layer. The first, second, and third magnetic layer groups are disposed in the order on the same side of the magnetic domain wall displacement layer. The magnetic domain wall is displaceable by flowing electrons between the first and third magnetic layer groups. The position of the magnetic domain wall in the magnetic domain wall displacement layer is detectable based on the difference in the electrical resistance across the second and first or third magnetic layer groups. The magnetic domain wall displacement layer is in antiferromagnetic coupling with the first magnetic layer group, and in antiferromagnetic or ferromagnetic coupling with the third magnetic layer group. The element enables detection of displacement of the magnetic domain wall by measuring the change in the electric resistance.

20 Claims, 8 Drawing Sheets

U.S. PATENT DOCUMENTS

| | | | |
|---|---|---|---|
| 2005/0045913 | A1 | 3/2005 | Nguyen et al. |
| 2006/0221674 | A1* | 10/2006 | Braun et al. ............... 365/158 |
| 2007/0217256 | A1* | 9/2007 | Ono ........................... 365/171 |
| 2007/0242505 | A1* | 10/2007 | Ochiai et al. ............... 365/171 |
| 2008/0094760 | A1* | 4/2008 | Lee et al. ................. 360/324.11 |
| 2008/0137405 | A1* | 6/2008 | Ohno et al. ................ 365/173 |

OTHER PUBLICATIONS

Yamanouchi, Michihiko, et al. "Abstract for 60th Annual Meeting Phys. Soc. Jpn." Mar. 27, 2005. p. 27aYP-5. Japan.

Berger, L. "Emission of spin waves by a magnetic multilayer traversed by a current." Physical Review B.; Oct. 1, 1996. pp. 9353-9358; vol. 54, No. 13. USA.

Slonczewski, J.C. "Letter to the Editor: Current-drive excitation of magnetic multilayers."; Journal of Magnetism and Magnetic Materials 159; 1996; pp. L1-L7; USA.

Katine, J.A. et al. "Current-Driven Magnetization Reversal and Spin-Wave Excitations in Co/Cu/Co Pillars"; Physical Review Letters; Apr. 2000; vol. 84, No. 14; pp. 3149-3152; USA.

Yamaguchi, A et al. "Real-Space Observation of Current-Driven Domain Wall Motion in Submicron Magnetic Wires"; Physical Review Letters; Feb. 20, 2004; vol. 92, No. 7; pp. 077205-1-077205-4; USA.

Related co-pending U.S. Appl. No. 11/278,613; Akira Saito; "Spin Injection Magnetic Domain Wall Displacement Device and Element Thereof"; (cont.) filing date Apr. 4, 2006; Spec. pp. 1-71; Figs. 1-22B.

* cited by examiner

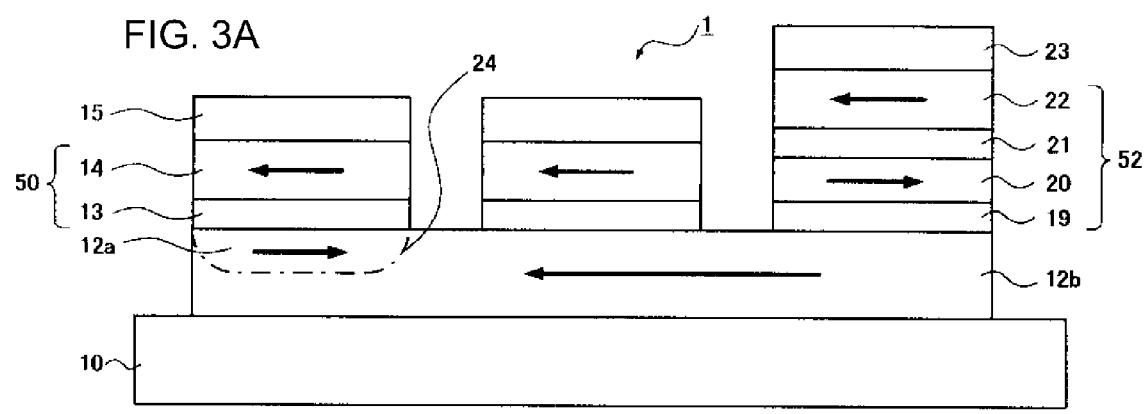
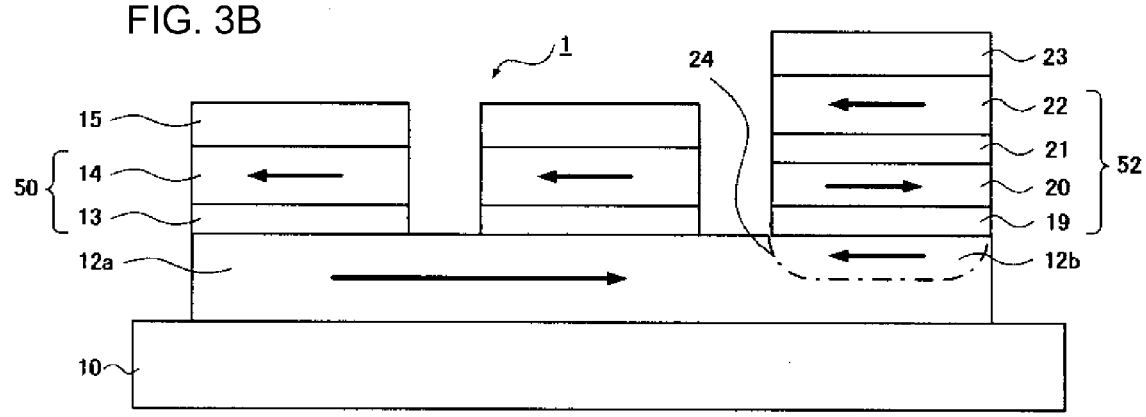
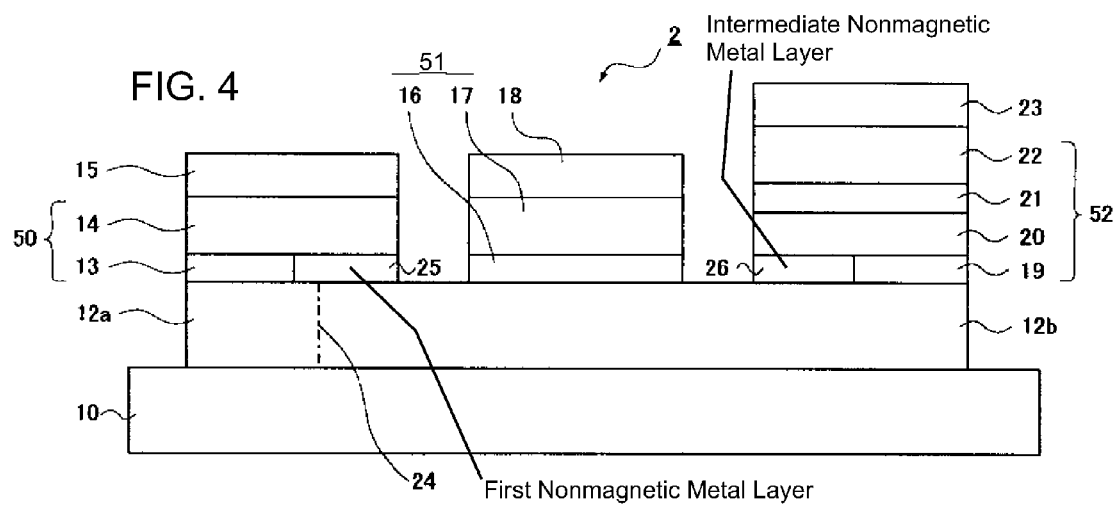

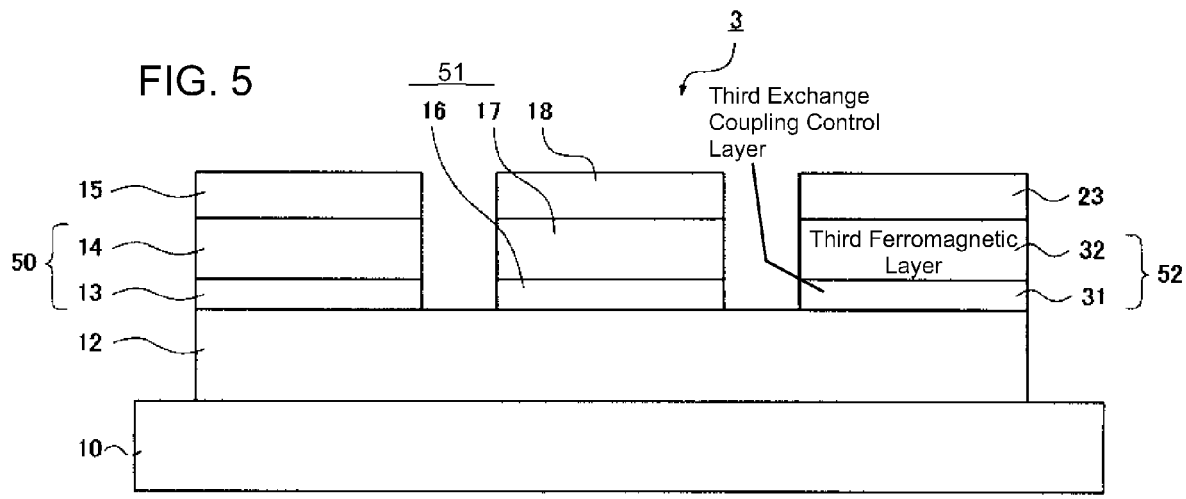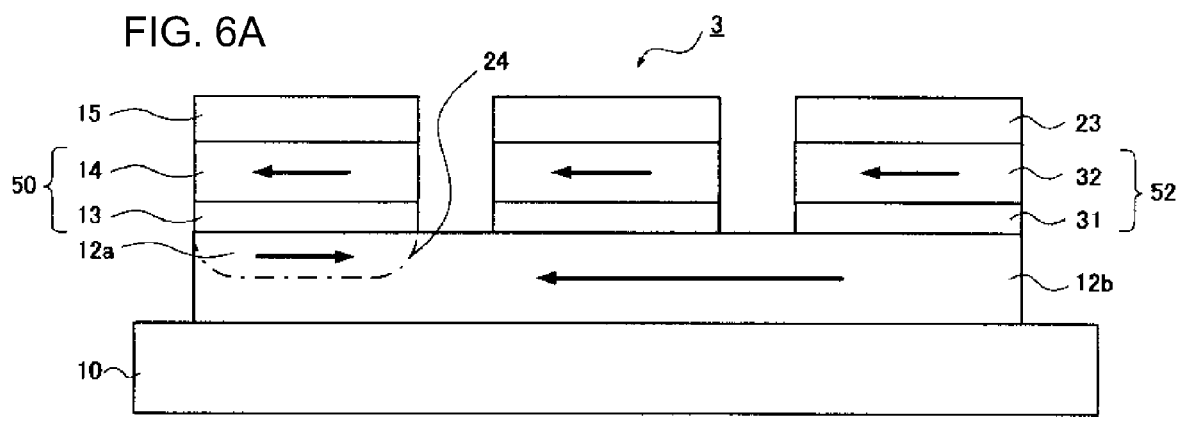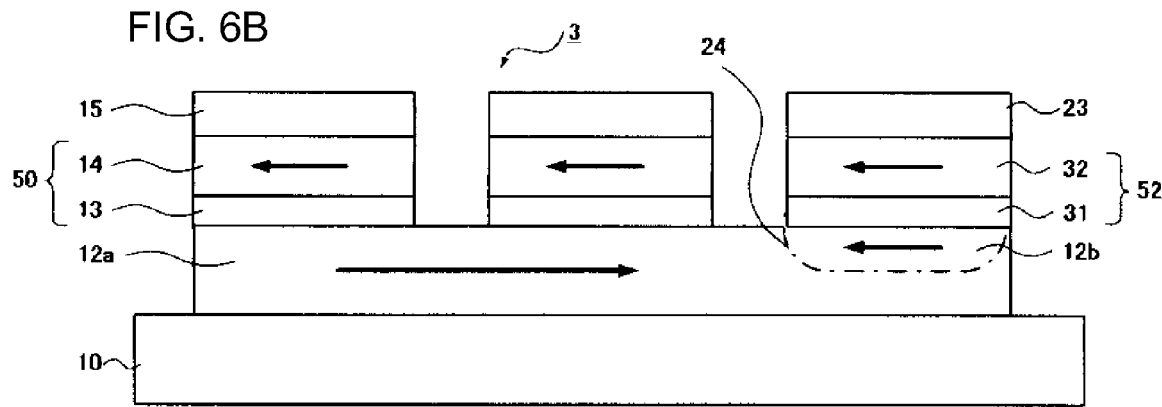

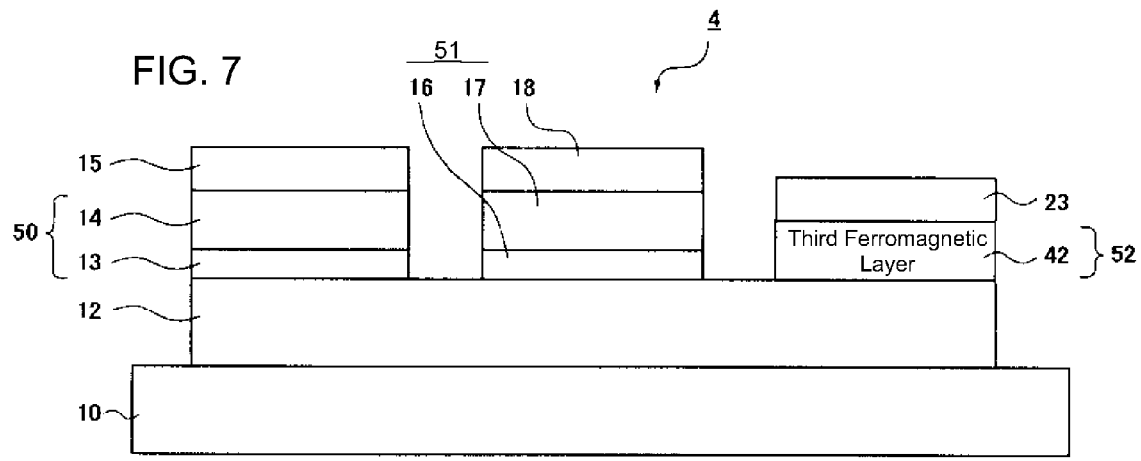
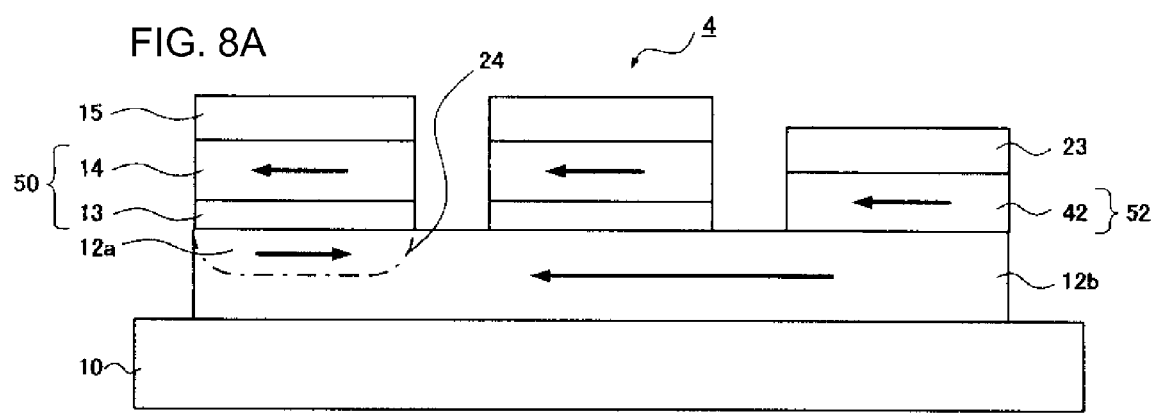
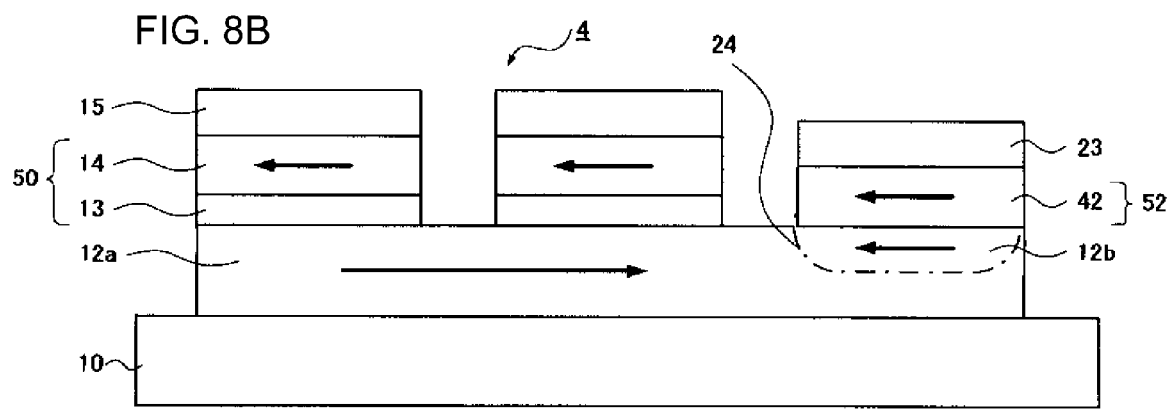

SPIN INJECTION MAGNETIC DOMAIN WALL DISPLACEMENT DEVICE AND ELEMENT THEREOF

BACKGROUND

FIG. 10 schematically shows a cross sectional structure for explaining an example of an arrangement of a previously proposed GMR (Giant Magneto-Resistance) element making use of a GMR effect. For example, on a silicon substrate 100, a lower electrode 101, a lower ferromagnetic layer 103 (with a thickness of approximately 40 nm and a diameter of approximately 100 nm) made of a material such as Co, a nonmagnetic metal layer 104 (with a thickness of approximately 6 nm and a diameter of approximately 100 nm), an upper ferromagnetic layer 105 (with a thickness of approximately 2.5 nm and a diameter of approximately 100 nm) made of a material such as Co, and an upper electrode 106 are formed in this order. Further, a bit line 102 is formed on the lower electrode 101. It is known that such a GMR structure element can reverse the direction of magnetization of the upper ferromagnetic layer 105 by spin current injection from the upper electrode 106 side, that is, injection of electrons with polarized spins from the lower electrode 101 side. See for example JP-A-2004-207707 and J. A. Katine, et al., *Current-Driven Magnetization Reversal and Spin-Wave Excitations in Co/Cu/Co Pillars,* Physical Review Letters, Vol. 84, No. 14, pp. 3149-3152 (2000).

The operation principle of the element is explained as follows. First, a magnetic field with a sufficient strength is applied to the element to align the directions of magnetization of the lower ferromagnetic layer 103 and the upper ferromagnetic layer 105 in the same direction. FIG. 11A schematically shows a cross sectional view of the element shown in FIG. 10 in which the directions of magnetization in the ferromagnetic layers are aligned rightwardly (arrows in the figure showing the direction of magnetization) in each ferromagnetic layer. In the following drawings, arrows have the same meaning. The state is to be referred to as the parallel state (P-state). In this state, an electric current flowing in the direction from the lower electrode 101 side to the upper electrode 106 side causes electrons to be injected from the upper electrode 106 to the upper ferromagnetic layer 105. In the upper electrode 106, the electron spins are in a state in which the distribution of up-spins matches that of down-spins. In the upper ferromagnetic layer 105, however, due to interaction (s-d interaction) between the electron spins and the spins of ferromagnetic metal atoms, spins of conduction electrons are polarized so that the spins in parallel with the direction of magnetization of the upper ferromagnetic layer 105 become the majority. This is referred to as polarization of spin. However, the upper ferromagnetic layer 105 of the layered films now being considered is thin, so that the polarization remains slight. When the conduction electrons with thus slightly polarized spins pass through the nonmagnetic metal layer 104 to reach the surface of the lower ferromagnetic layer 103, electrons having spins in parallel with the direction of magnetization of the lower ferromagnetic layer 103 are injected into the lower ferromagnetic layer 103. However, electrons having spins in the directions opposite to the direction of the magnetization of the lower ferromagnetic layer 103 are reflected to be injected into the upper ferromagnetic layer 105 again. The lower ferromagnetic layer 103, being thick, functions as a spin filter that gives priority to pass electrons having spins in the direction in parallel with the direction of the magnetization of the lower ferromagnetic layer 103 itself. As a result, the majority carriers in the upper ferromagnetic layer 105 become electrons having spins in the direction opposite to the direction of the magnetization of the lower ferromagnetic layer 103. Each of thus given electrons exerts a torque on the magnetization of the upper ferromagnetic layer 105 in the opposite direction to reverse the direction of magnetization thereof. Current exceeding a certain critical level causes the direction of the magnetization of the upper ferromagnetic layer 105 to rotate by the exerted torque, by which the state with the directions of magnetization of the upper ferromagnetic layer 105 and the lower ferromagnetic layer 103 changes from the P-state shown in FIG. 11A to the anti-parallel state (AP state) shown in FIG. 11B.

An explanation about the case in which current flows from the upper electrode 106 to the lower electrode 101 in the element in the AP-state now follows. In this case, electrons are injected from the lower electrode 101 to the lower ferromagnetic layer 103. Also, in the lower electrode 101, the electron spins are in the state in which the distribution of up-spins matches that of down-spins. In the ferromagnetic layers, however, there is interaction (s-d interaction) between the electron spins and the spins of ferromagnetic metal atoms. Here, the thick lower ferromagnetic layer 103 causes spins of conduction electrons to be polarized so that the spins in parallel with the direction of magnetization of the upper ferromagnetic layer 105 become the majority. When the conduction electrons with largely polarized spins pass through the nonmagnetic metal layer 104 to reach the surface of the upper ferromagnetic layer 105, the majority of electrons having spins in antiparallel with the direction of magnetization of the upper ferromagnetic layer 105 are injected into the upper ferromagnetic layer 105. As a result, each of the injected electrons, having spins in the directions in parallel with the direction of the magnetization of the lower ferromagnetic layer 103, exerts a torque on the magnetization of the upper ferromagnetic layer 105 in the opposite direction to reverse the direction of magnetization thereof. Current exceeding a certain critical level causes the direction of the magnetization of the upper ferromagnetic layer 105 to rotate by the exerted torque, by which the state with the directions of magnetization of the upper ferromagnetic layer 105 and the lower ferromagnetic layer 103 returns from the AP-state shown in FIG. 11B to the P state shown in FIG. 11A.

The electric resistance of a GMR element is known to be small in the P-state and large in the AP-state with the rate of change being several tens of percent. By using the GMR effect, a reading head can be manufactured for a hard disk. FIG. 12 is a schematic view showing a planar structure of an MRAM (Magnetic Random Access Memory) in which a plurality of the GMR elements shown in FIG. 10 are connected to use the inversion of magnetization of GMR elements by current injection. With the use of the arrangement as shown in FIG. 12, writing (inversion of magnetization) and reading out (detection of electric resistance values corresponding to states of magnetization of recording cells 109) of bit information to and from the recording cells 109 are principally possible by a group of laterally running word lines 108 and a group of longitudinally running bit lines 107.

FIGS. 13, 14A, and 14B are schematic cross sectional views each for explaining a phenomenon of displacement of a magnetic domain wall formed in a ferromagnetic wire in a related magnetic domain wall displacement element by a current flowing in the ferromagnetic wire. See for example A. Yamaguchi, et al., *Real-Space Observation of Current-Driven Domain Wall Motion in Submicron Magnetic Wires,* Physical Review Letters, Vol. 92 No. 7, 077205 (2004). FIG. 13 is a schematic cross sectional view showing an arrangement of the element, in which a ferromagnetic layer 121 (10 nm in thickness and several micrometers in length) is formed on an insulator substrate 120. On the ferromagnetic layer 121, a left electrode 122 and a right electrode 123 are formed. For the ferromagnetic layer 121, a material such as a permalloy ($Ni_{81}Fe_{19}$) thin film is used. For the left and right electrodes 122 and 123, a material such as copper (Cu), gold (Au), or platinum (Pt) is used. FIGS. 14A and 14B are schematic cross sectional views for explaining the principle of displacement of a magnetic domain wall 124 when current flows between the left electrode 122 and the right electrode 123. In each of the views, the directions of magnetization in the magnetic layer are shown with arrows like in the above explanation.

First, as shown in FIG. 14A, consider the case in which there is one magnetic domain wall 124 in the region of the ferromagnetic layer 121 between two electrodes and the direction of magnetization on the right side of the magnetic domain wall 124 is opposite to the direction of magnetization on the left side. When flowing current in this state from the right electrode 123 to the left electrode 122, the current crosses the magnetic domain wall 124. At this time, electrons are injected from the left electrode 122 into the ferromagnetic layer 121 to flow into the right electrode 123. The directions of spins of electrons injected into the ferromagnetic layer 121 are considered to be aligned by the s-d interaction in the same direction as the direction of magnetization in the region on the left side of the magnetic domain wall 124 in the ferromagnetic layer 121 (also referred to as polarization). The magnetization due to spins of the polarized electrons is taken as Sl (a rightward vector). Then, when the spin-polarized electrons pass through the magnetic domain wall 124 and are injected into the region on the right-hand side of the magnetic domain wall 124 of the ferromagnetic layer 121, the direction of spins of electrons is aligned this time by the s-d interaction in the same direction as the direction of magnetization opposite to the direction before the electrons pass through the magnetic domain wall 124. The magnetization due to spins of the electrons polarized on the right-hand side of the magnetic domain wall 124 is taken as Sr (a leftward vector). Moreover, the magnetization on the left-hand side of the ferromagnetic layer 124 and the magnetization on the right-hand side are taken as Ml (a rightward vector) and Mr (a leftward vector), respectively.

With the direction of Sl supposed to be positive, in the process in which electrons move from the left-hand side to the right-hand side of the magnetic domain wall 124, the magnetization Sl due to electron spin changes to Sr, resulting in an increase in electron spins in the negative direction. Before and after electrons cross the magnetic domain wall, the total sum (Ml+Sl+Mr+Sr) of magnetization of the magnetic material and spin angular momentum of conduction electrons is conserved to be constant. In a process in which conduction electrons on the left-hand side of the magnetic domain wall cross the magnetic domain wall, the total sum of whole spin angular momentum of electrons (Sl+Sr) increases by 2Sr (decreases by 2Sl). Since the total sum (Ml+Sl+Mr+Sr) of magnetization of the magnetic material and spin angular momentum of the conduction electrons is conserved, by the conduction electrons crossing the magnetic domain wall 124 from the left-hand side to the right-hand side, the total sum (Ml+Mr) of magnetization increases by 2Sl (decreases by 2Sr). In other words, by the conduction electrons crossing the magnetic domain wall 124 from the left-hand side to the right-hand side, the magnetization of the magnetic domain wall 124 is to go on increasing in the positive direction (in the direction of Ml). Namely, the magnetic domain wall 124 is to go on moving in the same direction as the direction in which electrons flow.

FIGS. 14A and 14B show the difference in position of the magnetic domain wall 124 between the state before current flows from the electrode 123 and the state after current flows from the right electrode 123. It is known that the magnetic domain wall 124 thus moves in the direction opposite to the direction in which current flows. It is reported that the current density enabling the displacement of the magnetic domain wall is of the order of $10^8$ A/cm$^2$ in the case of metallic magnetic material such as permalloy and of the order of $8 \times 10^4$ A/cm$^2$ in the case of ferromagnetic semiconductor and that, by increasing the current density, the displacement speed of the magnetic domain wall becomes of the order of 3 m/s. See for example Yamaguchi's paper and Michihiko Yamanouchi, Abstract for 60th Annual Meeting Phys. Soc. Jpn., p. 27aYP-5, Mar. 27 (2005).

Each of the above-explained two technologies inverts the magnetization direction by flow current in the element. Its operation principle is based on the fact that, when spin-polarized electrons are injected into a ferromagnet, a torque due to electron spin is exerted on the magnetization of the ferromagnet. At this time, the total of the magnetization due to spins of the injected free electrons and the magnetization of the ferromagnet is conserved. Thus, for bringing about inversion of magnetization with a slight amount of injected electrons (or an injected current), the volume and the magnitude of saturation magnetization of the ferromagnet subjected to inversion of magnetization must be made small.

For example, in the case of the MRAM shown in FIG. 12, when its volume and its saturation magnetization are made small, a problem arises in that thermal stability of recording bit, namely thermal stability of magnetization of the recording cell 109, is reduced, causing thermal fluctuation of magnetization by thermal disturbances, even at room temperature, making it impossible to keep the magnetization of the recording cell. Also in the arrangement shown in FIG. 13, for carrying out high speed displacement of the magnetic domain wall by a slight current, saturation magnetization must be lowered. However, lowering the magnetization saturation increases thermal fluctuation of magnetization forming the magnetic domain wall. Thus, it can be easily supposed that a problem arises in that the position of the magnetic domain wall is randomly displaced by thermal agitation.

Furthermore, with the structure shown in FIG. 13, although it is possible to induce a change in the state of magnetization, i.e., displacement of the magnetic domain wall, by supplying current, it is difficult to detect a state of magnetization. This is because, in the case of the arrangement shown in FIG. 13, only the position of the magnetic domain wall changes without a change in the length of the magnetic layer in which current flows. Although the ratio of the length of the region magnetized rightward and the length of the region magnetized leftward changes in the ferromagnet 121, it is considered that the rightward resistivity and the leftward resistivity are the same. Therefore, the difference in the electric resistance due to change in the ratio of the lengths is in a negligible level. Hence, only with such displacement of the magnetic domain wall, there is no large change in the electric resistance between both of the electrodes.

Accordingly, there remains a need for an element in which its magnetized state can be changed by flowing current between two electrodes thereof and changing the electric resistance between the two electrodes depending on its magnetized state, to improve the thermal stability, while the critical current necessary for changing the magnetized state remains small. Also, there remains a need for an element in which its magnetic domain wall is displaceable by flowing current between two electrodes of a magnetic material so that the electric resistance between the two electrodes is changed.

The present invention addresses this need.

SUMMARY OF THE INVENTION

The present invention relates to a basic structure element that can be applied to a magnetic sensor or a magnetic memory, and a device incorporating the element. More specifically, the invention relates to a plurality of the elements in which electron spin injection is controlled to form a magnetic random access memory having a large capacity and including no mechanical driving section or to the element forming a faint electric current sensor that detects electron spin injection.

One aspect of the present invention is a spin injection magnetic domain wall displacement element that includes a magnetic domain wall displacement layer having a magnetic domain wall, a first magnetic layer group having a first ferromagnetic layer, a second magnetic layer group having a second ferromagnetic layer, and a third magnetic layer group having a third ferromagnetic layer. The first magnetic layer group, the second magnetic layer group, and the third magnetic layer group are disposed in this order on one side of the magnetic domain wall displacement layer. The magnetic domain wall in the magnetic domain wall displacement layer is displaceable by flowing electrons between the first magnetic layer group and the third magnetic layer group. The position of the magnetic domain wall in the magnetic domain wall displacement layer is detectable by the difference in the electrical resistance of a region between the second magnetic layer group and the first or third magnetic layer group.

At least part of the magnetic domain wall displacement layer is in contact with the first magnetic layer group and is in antiferromagnetic coupling with part of the first magnetic layer group. At least part of the magnetic domain wall displacement layer is in contact with the third magnetic layer group and is in antiferromagnetic or ferromagnetic coupling with part of the third magnetic layer group.

The first magnetic layer group comprises a nonmagnetic first exchange coupling control layer and the first ferromagnetic layer laminated together. The first exchange coupling control layer is in contact with the magnetic domain wall displacement layer.

The second magnetic layer group comprises a second nonmagnetic metal layer and the second ferromagnetic layer laminated together. The second nonmagnetic metal layer is in contact with the magnetic domain wall displacement layer.

In one embodiment, the third magnetic layer group comprises a nonmagnetic intermediate exchange coupling control layer, an intermediate ferromagnetic layer, a nonmagnetic third exchange coupling control layer, and the third ferromagnetic layer laminated together in this order. The intermediate exchange coupling control layer is in contact with the magnetic domain wall displacement layer.

In another embodiment, the third magnetic layer group comprises a nonmagnetic exchange coupling control layer and the third ferromagnetic layer laminated together. The exchange coupling control layer is in contact with the magnetic domain wall displacement layer.

The film thickness of the intermediate ferromagnetic layer is smaller than the spin relaxation length of electrons in the intermediate ferromagnetic layer.

Another aspect of the present invention is a spin injection magnetic domain wall displacement device comprising a plurality of the spin injection magnetic domain wall displacement elements described above. The spin injection magnetic domain wall displacement elements are coupled with one another with the first magnetic layer groups thereof connected to one of a group of word or bit lines, with the third magnetic layer groups thereof connected to the other of a group of the word or bit lines, and with the second magnetic layer groups thereof connected to data read-out lines. The device can record and read based on the difference in the electric resistance of a region between the second and first or third magnetic layer groups.

BRIEF DESCRIPTION OF THE DRAWINGS

FIG. 3A illustrates the embodiment of FIG. 1 in the state of a magnetic domain wall when a sufficient amount of current flows from the first electrode to the third electrode in the state shown in FIG. 2A or FIG. 2B.

FIG. 3B illustrates the embodiment of FIG. 1 in the state of a magnetic domain wall when a sufficient amount of current flows from the third electrode to the first electrode in the state shown in FIG. 2A or FIG. 2B.

FIG. 4 is a schematic cross sectional view for explaining an example of another arrangement of the first embodiment of the spin injection magnetic domain wall displacement element according to the invention.

FIG. 5 is a schematic cross sectional view for explaining an example of the basic arrangement of a second embodiment of the spin injection magnetic domain wall displacement element according to the invention.

FIG. 6A illustrates the embodiment of FIG. 5 in the initialized state or in the state when current flows from the first electrode to the third electrode in the state shown in FIG. 6B for explaining the operation principle thereof.

FIG. 6B illustrates the embodiment of FIG. 5 in the state when current flows from the third electrode to the first electrode in the state shown in FIG. 6A for explaining the operation principle thereof.

FIG. 7 is a schematic cross sectional view for explaining an example of another arrangement of the second embodiment of the spin injection magnetic domain wall displacement element according to the invention.

FIG. 8A illustrates the embodiment of FIG. 7 in the initialized state or in the state when current flows from the first electrode to the third electrode in the state shown in FIG. 8B for explaining the operation principle thereof.

FIG. 8B illustrates the embodiment of FIG. 7 in the state when current flows from the third electrode to the first electrode in the state shown in FIG. 8A.

DETAILED DESCRIPTION

Figure 1:
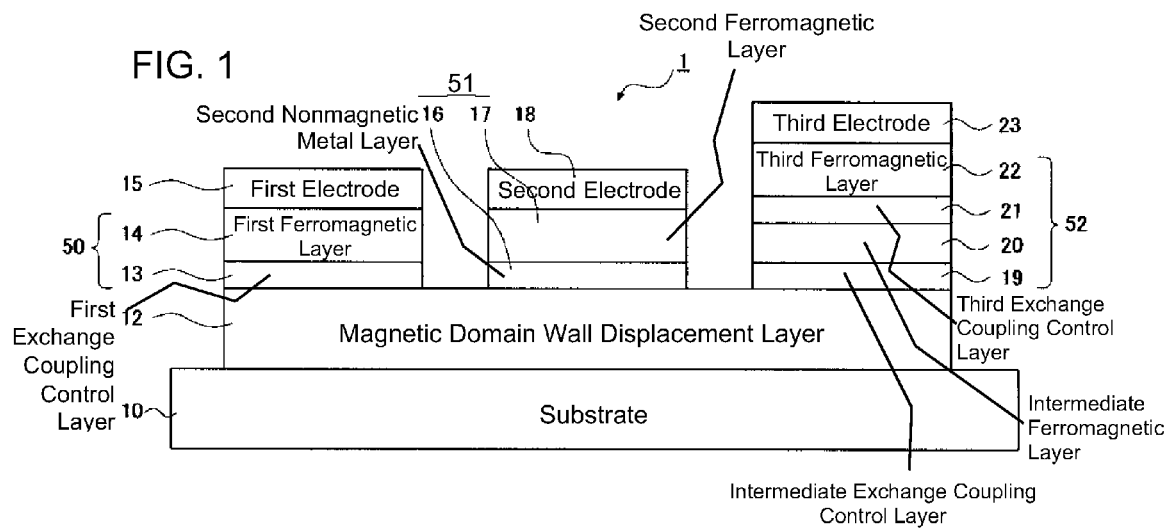
FIG. 1 is a schematic cross sectional view for explaining an example of the basic arrangement of the first embodiment of a spin injection magnetic domain wall displacement element according to the invention.

FIG. 1 is a schematic cross sectional view for explaining an example of the basic arrangement of the first embodiment of a spin injection magnetic domain wall displacement element 1 according to the invention. On a substrate 10, a magnetic domain wall displacement layer 12 is formed. First, second, and third magnetic layer groups 50, 51, 53 are formed in this order on one side of the magnetic domain wall displacement layer 12. The first magnetic layer group 50 is formed on one end of the magnetic domain wall displacement layer 12 and a first electrode 15 is formed on the first magnetic group 50. On the other end of the magnetic domain wall displacement layer 12, the third magnetic layer group 52 is formed and a third electrode 23 is formed on the third magnetic layer group 52. At a position between the first magnetic layer group 50 and the third magnetic layer group 52, the second magnetic layer group 51 is formed on the magnetic domain wall displacement layer 12 and a second electrode 18 is formed on the second magnetic layer group 51.

The first magnetic layer group 50 includes a first exchange coupling control layer 13 formed on the magnetic domain wall displacement layer and a first ferromagnetic layer 14 formed on the first exchange coupling control layer. The second magnetic layer group 51 includes a second nonmagnetic metal layer 16 and a second ferromagnetic layer 17 formed in this order on the magnetic domain wall displacement layer 12. The third magnetic layer group 52 includes an intermediate exchange coupling control layer 19, an intermediate ferromagnetic layer 20, a third exchange coupling control layer 21, and a third ferromagnetic layer 22 are formed in this order on the magnetic domain wall displacement layer 12.

FIGS. 2A and 2B and FIGS. 3A and 3B are schematic cross sectional views for explaining the operation principle of the example of the arrangement of the element shown in FIG. 1. In each of the magnetic layers in the spin injection magnetic domain wall displacement element 1, the direction of magnetization thereof is shown with an arrow. The magnetic domain wall displacement layer 12 is divided by a magnetic domain wall 24 into a magnetic domain wall displacement layer 12a on the first electrode 15 side and a magnetic domain wall displacement layer 12b on the third electrode 23 side. The arrangement shown in FIG. 1 is the minimum unit of the element and the necessary number of the elements disposed on the same substrate to form a desired device. Circuits and driving elements for driving the elements according to the invention can be also arranged on the same substrate.

The material for the substrate 10 can be selected as required depending on the desired flatness when the material has an insulation property for individually controlling a plurality of the elements arranged on the substrate and has sufficient rigidity for holding the elements. For example, an insulating substrate of sapphire or silicon oxide with a thickness of several hundreds of micrometers or a semiconductor substrate whose surface is oxidized to ensure insulating property can be used.

The material of the first electrode 15 can be selected as required when it is a conductive material. The thickness thereof is preferably within the range from several tens of nanometers to several hundreds of nanometers and its area is preferably within the range from 20 nm×20 nm to 300 nm×300 nm. Moreover, the shape thereof is preferably a rectangle, but can be a circle or an oval as desired.

The first magnetic layer group 50 is for providing antiferromagnetic coupling between the first ferromagnetic layer 14 and the magnetic domain wall displacement layer 12a on the first electrode 15 side in part of the magnetic domain wall displacement layer 12. By the antiferromagnetic coupling thus provided, the direction of magnetization of the magnetic domain wall displacement layer 12a on the first electrode 15 side is fixed in the direction opposite to the direction of the magnetization of the first ferromagnetic layer 14.

The material of the first ferromagnetic layer 14 can be selected as necessary from materials having ferromagnetism. For example, materials such as a CoPt alloy, a CoCr alloy, a CoPtCr alloy, a CoPtCrB alloy, a CoPtCrTaB alloy, a CoPt artificial lattice film (an ordered alloy), and a CoPtCr—$SiO_2$ granular material can be used. During the operation of the element, the magnetization of the first ferromagnetic layer 14 is preferably fixed in one direction. Thus, the first ferromagnetic layer 14 has preferably a high coercive force and a large film thickness. The coercive force is preferably from 2000 to 4000 Oe and the thickness is preferably from 50 nm to 200 nm. Moreover, for the material thereof, an ordered alloy such as $Co_{50}Pt_{50}$ is particularly preferable. This is because some ordered alloys are known to have magnetic anisotropy constants Ku exceeding $1\times10^7$ erg/cm$^2$. With such alloys the direction of magnetization can be kept stably.

The first exchange coupling control layer 13 is a nonmagnetic layer for separating the first ferromagnetic layer 14 from the magnetic domain wall displacement layer 12 with a specified clearance to control an exchange coupling constant in the exchange coupling between the first ferromagnetic layer 14 and the magnetic domain wall displacement layer 12a on the first electrode 15 side. The material thereof is preferably Ru, V, C, Nb, Mo, Rh, Ta, W, Re, Ir, Pt, or Pd, or an alloy with the main ingredient being any one of the elements. The exchange coupling constant changes from positive value to negative value depending on the thickness of the first exchange coupling control layer 13. Consequently, the thickness of the first exchange coupling control layer 13 is selected so that antiferromagnetic coupling is provided between the first ferromagnetic layer 14 and the magnetic domain wall displacement layer 12a on the first electrode 15 side. However, an excessive thickness of the first exchange coupling control layer 13 causes weak exchange coupling. Therefore, the thickness is preferably determined as being from 0.5 to 3 nm. For example, when the first ferromagnetic layer is made of a CoPt alloy, the first exchange coupling control layer 13 is made of Ru and the magnetic domain wall displacement layer 12 is made of a CoHfTa alloy, an antiferromagnetic coupling can be provided with the film thickness of Ru at 0.8 nm and a ferromagnetic coupling can be provided with the film thickness of Ru at 1.8 nm.

The magnetic domain wall displacement layer 12 is a layer that makes the electric resistance value of the entire spin injection magnetic domain wall displacement element 1 change depending on the position of the magnetic domain wall 24 formed in the layer and brings about hysteresis. The detailed explanation of the operation thereof will be given later. The material can be any magnetic material with a magnetic domain wall presented therein, for which a material such as magnetic metal, ferromagnetic semiconductor, or ferromagnetic oxide can be used. This is preferably a material such as permalloy, a CoFe alloy, a CoFeB alloy, a NiCoFe alloy, an FeCoN alloy, an FeAlN alloy, a CoCrFeAl alloy, Fe, a FePt alloy, a NiMnSb alloy, a CoMn group alloy, a CoZrNb alloy, $Sr_2FeMoO_6$, $Fe_2O_3$, or CoHfa. Particularly preferable one is permalloy, $Co_{90}Fe_{10}$, $Co_2MnAl$, $Co_2MnSi$, or $Co_2MnGe$. The film thickness thereof is preferably from 20 nm to 500 nm. It is necessary for the direction of magnetization of the magnetic domain wall displacement layer 12a on the first electrode 15 side to be easily controlled depending on the direction of magnetization of the first ferromagnetic layer 14, or for the direction of magnetization of the magnetic domain wall displacement layer 12b on the third electrode 23 side to be easily controlled depending on the direction of magnetization of the third ferromagnetic layer 12. Therefore, the coercive force of the magnetic domain wall displacement layer 12 is preferably equal to 10 Oe or less. The size thereof only needs to fit the first magnetic layer group 50, the second magnetic layer group 51, and the third magnetic layer group 52 formed thereon, while being spaced from one another with a desired distance. For integrating a plurality of elements with a high density, a rectangular shape with a width from 30 to 200 nm and a length from 60 to 1000 nm is preferable.

The third magnetic layer group 52 is for providing an antiferromagnetic coupling between the third ferromagnetic layer 22 and the intermediate ferromagnetic layer 20, and between the intermediate ferromagnetic layer 20 and the magnetic domain wall displacement layer 12b on the third electrode 23 side. By the antiferromagnetic coupling thus provided, the direction of magnetization of the magnetic domain wall displacement layer 12b on the third electrode 23 side is fixed in the same direction as the direction of the magnetization of the third ferromagnetic layer 22. Furthermore, by adequately controlling the film thickness of the intermediate ferromagnetic layer 20, spins of injected electrons is controlled.

The intermediate exchange coupling control layer 19 is a nonmagnetic layer for separating the intermediate ferromagnetic layer 20 from the magnetic domain wall displacement layer 12 with a specified clearance to control an exchange coupling constant in the exchange coupling between the intermediate ferromagnetic layer 20 and the magnetic domain wall displacement layer 12b on the third electrode 23 side. The material and the film thickness of the intermediate exchange coupling control layer 19 are determined similarly to those for the first exchange coupling control layer 13.

The intermediate ferromagnetic layer 20 is for providing the above antiferromagnetic coupling and for injecting electrons into the adjacent layer with the spins of the injected electrons conserved. For example, electrons injected from the intermediate exchange coupling control layer 19 pass through the intermediate ferromagnetic layer 20 and are injected into the third exchange coupling control layer 21 with respective polarized states of electron spins almost being conserved. The film thickness of the intermediate ferromagnetic layer 20 must be made smaller compared with the relaxation length of electron spin. Thus, the film thickness of the intermediate ferromagnetic layer 20 is preferably 50 nm or less. For well conserving the polarized state of electron spin, the film thickness between 5 nm and 20 nm is particularly preferable.

Moreover, the direction of magnetization of the intermediate ferromagnetic layer 20 must be easily controlled by the magnetization of the third ferromagnetic layer 22. Thus, the material of the intermediate ferromagnetic layer 20 is preferably provided as a material having a smaller coercive force in comparison with the material of the third ferromagnetic layer 22. Thus, materials such as permalloy such as a $Ni_{45}Fe_{55}$ alloy and a $Ni_{81}Fe_{19}$ alloy, and alloys such as a CoHfTa alloy, a CoZrNb alloy, a CoFe alloy, a FeCoN alloy, an FeAlN alloy, a NiFeMo alloy, and an FeTaN alloy are preferable. Furthermore, the coercive force is preferably provided as 200e or less.

The third exchange coupling control layer 21 is a nonmagnetic layer for separating the intermediate ferromagnetic layer 20 from the third ferromagnetic layer 22 with a specified clearance to control an exchange coupling constant in the exchange coupling between the intermediate ferromagnetic layer 20 and the third ferromagnetic layer 22. The material and the film thickness of the third exchange coupling control layer 21 are determined similarly to those for the first exchange coupling control layer 13.

The third ferromagnetic layer 22 can be selected as necessary from materials having ferromagnetism and materials similar to those for the first ferromagnetic layer 14 can be used. During the operation of the element, the magnetization of the third ferromagnetic layer 22 is preferably fixed in one direction. Thus, the third ferromagnetic layer 22 has preferably a high coercive force and a large film thickness. The coercive force is preferably from 2000 to 4000 Oe and the thickness is preferably from 50 nm to 200 nm.

The material of the third electrode 23 can be selected as required when it is a conductive material. The thickness thereof is preferably within the range from several tens of nanometers to several hundreds of nanometers and its area is preferably within the range from 20 nm×20 nm to 300 nm×300 nm. Moreover, the shape thereof is preferably a rectangle, but can be a circle or an oval as desired.

The second magnetic layer group 51 is for reading out records by detecting the direction of magnetization in the magnetic domain wall displacement layer 12. The second nonmagnetic metal layer 16 is a layer for ensuring conductivity between the second ferromagnetic layer 17 and the magnetic domain wall displacement layer 12 as well as for cutting off the magnetic coupling between the second ferromagnetic layer 17 and the magnetic domain wall displacement layer 12. Here, cutting off the magnetic coupling means that the direction of magnetization is in a state of being not fixed to a specified relation for a section of the magnetic domain wall displacement layer 12 facing the second ferromagnetic layer 17 with the second nonmagnetic metal layer 16 disposed therebetween. More specifically, this means that, in the section in contact with the second nonmagnetic metal layer 16 in the magnetic domain wall displacement layer 12, the direction of magnetization can be taken as either state of rightward and leftward when the direction of magnetization of the second ferromagnetic layer 17 is rightward. The material for the second nonmagnetic metal layer 16 is preferably Cu, Cr, V, or its alloy, or an oxide of Al. Moreover, the second nonmagnetic metal layer 16 can be provided by laminating a plurality of nonmagnetic metal layers.

The material of the second ferromagnetic layer 17 can be selected as necessary from materials having ferromagnetism and materials similar to those for the first ferromagnetic layer 14 can be used. During the operation of the element, the magnetization of the second ferromagnetic layer 17 is preferably fixed in one direction. Thus, the second ferromagnetic layer 17 has preferably a high coercive force and a large film thickness. The coercive force is preferably from 2000 to 4000 Oe and the thickness is preferably from 50 nm to 200 nm.

The material of the second electrode 18 can be selected as required when it is a conductive material. The thickness thereof is preferably within the range from several tens of nanometers to several hundreds of nanometers and its area is preferably within the range from 20 nm×20 nm to 300 nm×300 nm. Moreover, the shape thereof is preferably a rectangle, but can be a circle or an oval as desired.

The area of each of the first ferromagnetic layer 14 and the first exchange coupling control layer 13 is preferably made equivalent to the area of the first electrode 15. The area of each of the second ferromagnetic layer 17 and the second nonmagnetic metal layer 16 is preferably made equivalent to the area of the second electrode 18. Moreover, the area of each of the layers from the intermediate exchange coupling control layer 19 to the third ferromagnetic layer 22 is preferably made equivalent to the area of the third electrode 23.

Each of the layers on the substrate 10 can be formed by a known deposition method for which methods such as sputtering, CVD, and evaporation can be used.

Figure 2A:
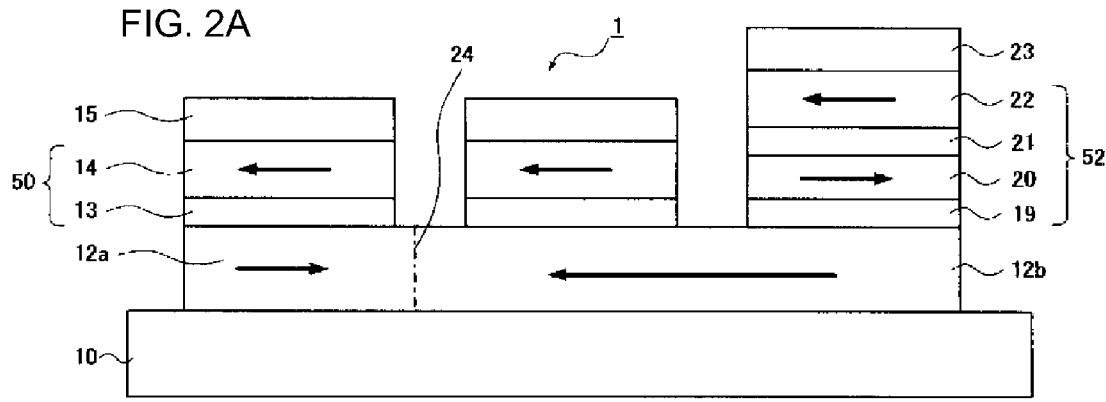
FIG. 2A illustrates the embodiment of FIG. 1 in the initialized state or in the state when current flows from a first electrode to a third electrode in the state shown in FIG. 2B for explaining the operation principle thereof.
Figure 13:
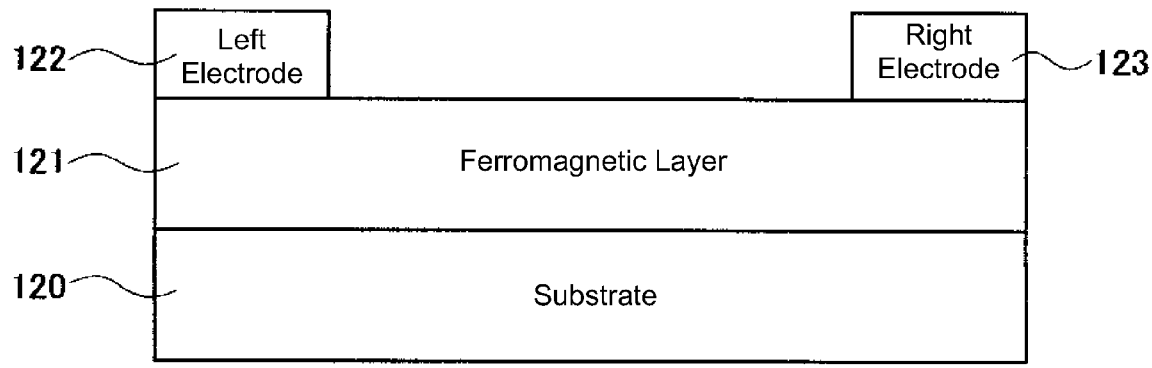
FIG. 13 is a schematic cross sectional view showing an arrangement of a related magnetic domain wall displacement element.
Figure 14A:
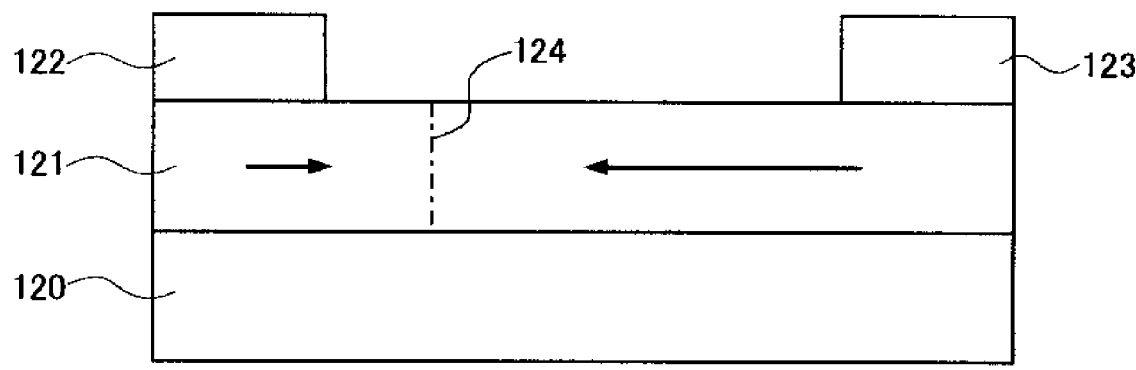
FIG. 14A illustrates the embodiment of FIG. 13 in the initial state or in the state when current flows from a left electrode to a right electrode in the state shown in FIG. 14B for explaining the principle of displacement of a magnetic domain wall thereof.
Figure 14B:
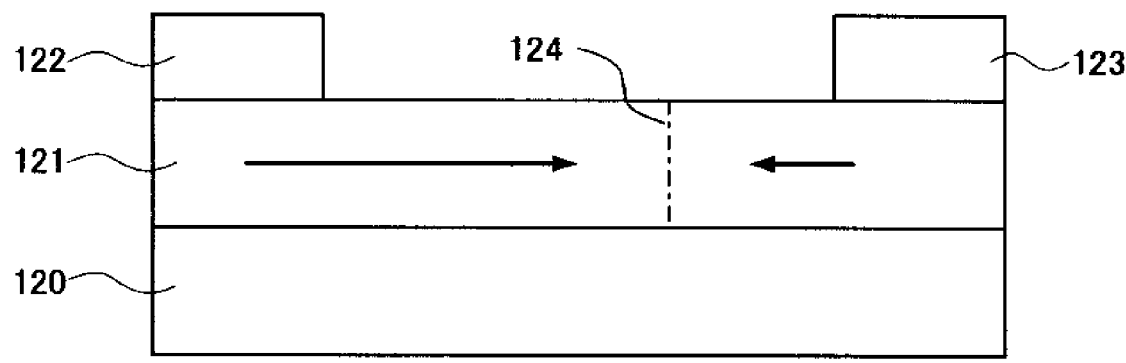
FIG. 14B illustrates the embodiment of FIG. 13 in the state when current flows from the right electrode to the left electrode in the state shown in FIG. 14A for explaining the principle of displacement of the magnetic domain wall thereof.

The operation principle of the element according to the first embodiment now follows, referring to FIGS. 2A and 2B and FIGS. 3A and 3B. First, the operation principle in the case of carrying out writing or recording in the element will be explained. Referring to FIG. 2A, the element is initialized first. Here, the element is in a magnetized state when a strong leftward magnetic field equivalent to a saturation magnetic field is applied to the element to provide leftward magnetization to all of the first ferromagnetic layer 14, the second ferromagnetic layer 17, and the third ferromagnetic layer 22. An antiferromagnetic coupling is provided between the first ferromagnetic layer 14 and the magnetic domain wall displacement layer 12a on the first electrode 15 side, and the coercive force of the first ferromagnetic layer 14 is higher than the coercive force of the magnetic domain wall displacement layer 12. This causes rightward magnetization, becoming opposite to the direction of magnetization of the first ferromagnetic layer 14, to be induced in the magnetic domain wall displacement layer 12a on the first electrode 15 side. Moreover, an antiferromagnetic coupling is provided between the third ferromagnetic layer 22 and the intermediate ferromagnetic layer 20, and the coercive force of the third ferromagnetic layer 22 is higher than the coercive force of the intermediate ferromagnetic layer 20. This causes rightward magnetization, opposite to the direction of magnetization of the third ferromagnetic layer 22, to be induced in the intermediate ferromagnetic layer 20. Furthermore, an antiferromagnetic coupling is provided between the intermediate ferromagnetic layer 20 and the magnetic domain wall displacement layer 12b on the third electrode 23 side. This causes leftward magnetization, becoming opposite to the direction of magnetization of the intermediate ferromagnetic layer 20, to be induced in the magnetic domain wall displacement layer 12b on the third electrode 23 side. Therefore, the directions of magnetization induced in the magnetic domain wall displacement layers 12a and 12b are to be invariably opposite to each other. Since the coercive force of the magnetic domain wall displacement layer 12 is small, a plurality of magnetic domain walls are produced in some cases. However, by flowing current from the first electrode 15 to the third electrode 23 on the basis of the principle explained with reference to FIGS. 13, 14A, and 14B, the magnetic domain walls can be concentrated to the position of the magnetic wall 24 shown in FIG. 2A. Moreover, in the magnetic domain wall displacement layer 12a on the first electrode 15 side, by the antiferromagnetic coupling with the first ferromagnetic layer 14, magnetization in the direction opposite to the direction of magnetization of the first ferromagnetic layer 14 is invariably induced. Thus, even in the case of continuously flowing current from the first electrode 15 to the third electrode 23, one stable magnetic domain wall can be formed in the magnetic domain wall displacement layer 12. As explained above, the direction of magnetization in the magnetic domain wall displacement layer 12 is not restricted by the direction of magnetization in the second ferromagnetic layer 17.

Figure 2B:
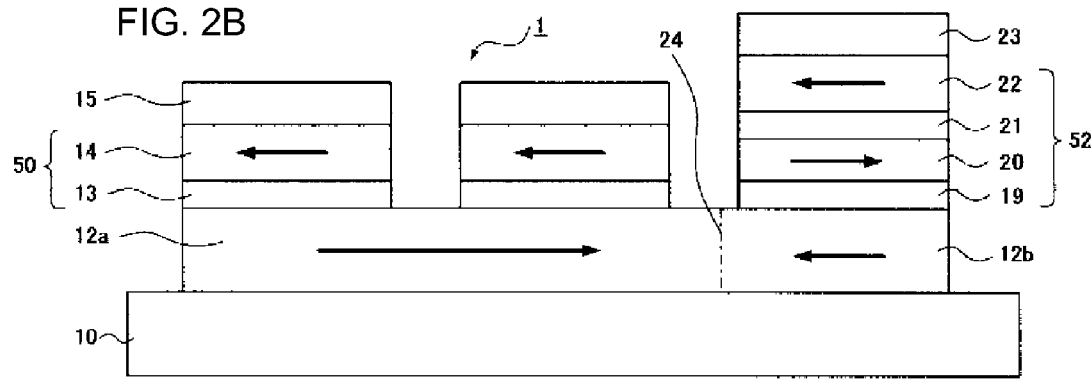
FIG. 2B illustrates the embodiment of FIG. 1 in the state when current flows from the third electrode to the first electrode in the state shown in FIG. 2A for explaining the operation principle thereof.

In the element in the state as shown in FIG. 2A, a current continuously flowing from the third electrode 23 toward the first electrode 15 causes the magnetic domain wall 24 to displace in the direction opposite to the direction of the current. FIG. 2B shows the case in which the current is stopped when the magnetic domain wall 24 reaches the left end of the third magnetic layer group 52. The antiferromagnetic coupling between the intermediate ferromagnetic layer 20 and the magnetic domain wall displacement layer 12b on the third electrode 23 side causes magnetization in the direction opposite to the direction of magnetization of the intermediate ferromagnetic layer 20 to be invariably induced in the magnetic domain wall displacement layer 12b on the third electrode 23 side. Therefore, one stable magnetic domain wall is formed in the magnetic domain wall displacement layer 12 without disappearance. When the film thickness of the magnetic domain wall displacement layer 12 is large, by further flowing current, the magnetic domain 24 also can be displaced to the position shown in FIG. 3B. Namely, it is possible to localize the magnetic domain wall displacement layer 12b on the third electrode 23 side close to the third magnetic layer group 52 and to make the thickness thereof sufficiently smaller compared with electron spin relaxation length. For example, the thickness can be made on the order of 20 nm.

In the element in the state as shown in FIG. 2B, a current continuously flowing from the first electrode 15 toward the third electrode 23 causes an operation carried out in reverse to the foregoing, by which the element is brought to the state as shown in FIG. 2A. Moreover, by further flowing a current, the magnetic domain 24 also can be displaced to the position shown in FIG. 3A. Namely, it is possible to localize the magnetic domain wall displacement layer 12a on the first electrode 15 side close to the first magnetic layer group 50 and to make the thickness thereof sufficiently smaller compared with electron spin relaxation length. For example, the thickness can be made on the order of 20 nm.

In this way, by reversing the direction of current, the magnetic domain wall 24 can be freely positioned at either end section of the magnetic domain wall displacement layer 12. In a comparison of the amount of current required for the magnetic domain wall displacement between positions shown in FIG. 2A and FIG. 2B with the amount required for displacement between positions shown in FIG. 3A and FIG. 3B, the amount in the displacement between the positions shown in FIG. 2A and FIG. 2B can be made smaller.

Next, the operation principle in the case of reading out a record or detecting a state of magnetization in the element follows. The operation principle is based on the fact that the behavior of electron spin differs depending on the relative relation between the thickness of a magnetic layer and the electron spin relaxation length. More specifically, the principle is based as follows. When the thickness of a magnetic layer is sufficiently smaller compared with the electron spin relaxation length, electrons pass through the magnetic layer with most of their spins being conserved. While, when the thickness of the magnetic layer is equivalent to or greater than the electron spin relaxation length, electrons pass through the magnetic layer with their spins polarized by the magnetization of the magnetic layer.

In the following, a method of detecting the difference in electric resistance of an element will be explained with the case taken as an example in which case a detecting current is made to flow from the third electrode 23 to the second electrode 18 (namely, the case of injecting electrons from the second electrode 18 toward the third electrode 23) for the element shown in FIG. 1. In the state shown in FIG. 3A, electrons flow in the following path (Electron path 1): the second electrode 18—the thick second ferromagnetic layer 17 in the leftward magnetized state—the nonmagnetic second nonmagnetic metal layer 16—the thick magnetic domain wall displacement layer 12b with the leftward magnetized state being induced therein—the nonmagnetic intermediate exchange coupling control layer 19—the thin intermediate ferromagnetic layer 20 in the rightward magnetized state—the nonmagnetic third exchange coupling control layer 21—the thick third ferromagnetic layer 22 in the leftward magnetized state—the third electrode 23. Here, the meaning of each layer being "thick" or "thin" is as follows. When the distance an electron passes through in the layer is equivalent to or greater in comparison with the electron spin relaxation length, it is expressed as being "thick," and when the distance is sufficiently shorter in comparison with the electron spin relaxation length, it is expressed as being "thin." When considering the film thickness, a thin film thickness is that of the order of 20 nm, for example, and a thick film thickness is that of the order of 200 nm, for example.

In the state shown in FIG. 3B, electron flows in the following path (Electron Path) (the meaning of the expressions of "thick" and "thin" are the same as that in the foregoing): the second electrode 18—the thick second ferromagnetic layer 17 in the leftward magnetized state—the nonmagnetic second nonmagnetic metal layer 16—the thick magnetic domain wall displacement layer 12a in the rightward magnetized state—the thin magnetic domain wall displacement layer 12b with the leftward magnetized state being induced therein—the nonmagnetic intermediate exchange coupling control layer 19—the thin intermediate ferromagnetic layer 20 in the rightward magnetized state—the nonmagnetic third exchange coupling control layer 21—the thick third ferromagnetic layer 22 in the leftward magnetized state—the third electrode 23.

The spin-polarized electrons are scattered or reflected at an interface with a magnetic material magnetized in the direction different from the direction of the spins of the electrons to increase the electric resistance. Moreover, when the electrons pass through a thick magnetic layer, the directions of the spins of electrons are polarized in the direction of the magnetization of the magnetic material. A comparison will be made between Electron path 2 and the Electron path 1. In Electron path 2, electrons with their spins polarized in the direction of the leftward magnetization (here, this is considered as the down-spin) in the second ferromagnetic layer 17 by the s-d interaction are largely scattered or reflected at the interface with the thick magnetic domain wall displacement layer 12a to thereby increase the electric resistance. However, the electrons with down-spins injected into the magnetic domain wall displacement layer 12a are this time polarized by the s-d interaction to electrons with up-spins (spins in the direction of the magnetization of the thick magnetic domain wall displacement layer 12a). The electrons with the up-spins, when injected into the thin magnetic domain wall displacement layer 12b, are to be weakly scattered or reflected at the interface. Since the magnetic domain wall displacement layer 12b is thin, the electrons with the up-spins injected into the thin magnetic domain wall displacement layer 12b, with their spins being kept polarized in the up-spins, reach the intermediate ferromagnetic layer 20 whose direction of magnetization is the same as the direction of the up-spin. As a result, at the interface with the intermediate ferromagnetic layer 20, the electrons are subjected to no large scattering and reflection. Furthermore, the electrons pass through the thin intermediate ferromagnetic layer 20 with the up-spins being kept unchanged and are to be largely reflected and scattered at the interface with the thick third ferromagnetic layer 22.

In Electron path 1, electrons with their spins polarized in the down-spins (spins in the direction of the leftward magnetization), in the second ferromagnetic layer 17 by the s-d interaction are injected into the magnetic domain wall displacement layer 12b whose direction of magnetization is the same as the direction of the down-spin. Thus, the injected electrons are subjected to no large scattering and reflection at the interface with the thin magnetic domain wall displacement layer 12b. Furthermore, the electrons pass through the magnetic domain wall displacement layer 12b with their down-spins being kept unchanged to reach the intermediate ferromagnetic layer 20 with the direction of magnetization being different from the direction of the down-spin. At the interface with the intermediate ferromagnetic layer 20, the electrons are subjected to weak scattering or reflection. However, the thin intermediate ferromagnetic layer 20 allows the electrons to reach up to the third ferromagnetic layer 22, having the direction of magnetization being the same as the direction of the down-spin, with the down-spins of the electrons being kept unchanged.

When electrons are injected into a magnetic film, with electrons having spins with the directions different from the direction of magnetization in the magnetic film, there exists a potential barrier at the interface of the magnetic film. Therefore, the electrons are scattered or reflected by the potential barrier. The case in which electrons are largely scattered or reflected by a potential barrier at an interface to largely increase the electric resistance is the case in which sufficiently spin-polarized electrons are injected into a thick magnetic material magnetized in the direction different from the directions of spin angular momentum of the electrons. That is, a combination of directions of magnetization of thick magnetic layers largely contributes to spin-dependent conduction. More specifically, the electric resistance of the element largely changes depending on whether the directions of magnetization of thick magnetic layers are in an antiparallel state or in a parallel state. However, influence that the direction of magnetization of a thin magnetic layer between thick magnetic layers has on the electric resistance is small.

A comparison with only combinations of the directions of magnetization of thick magnetic layers extracted from Electron paths 1 and 2 is given as follows. In Electron path 1: the thick second ferromagnetic layer 17 in the leftward magnetized state—the thick magnetic domain wall displacement layer 12b in the leftward magnetized state—the thick third ferromagnetic layer 22 in the leftward magnetized state. In Electron path 2: the thick second ferromagnetic layer 17 in the leftward magnetized state—the thick magnetic domain wall displacement layer 12a in the rightward magnetized state—the thick third ferromagnetic layer 22 in the leftward magnetized state.

In Electron path 2, electrons with their spins polarized leftward in the second ferromagnetic layer 17 by the s-d interaction are injected into the thick magnetic domain wall displacement layer 12a magnetized rightward. Furthermore, electrons with their spins polarized rightward by the s-d interaction in the magnetic domain wall displacement layer 12a are to be injected into the third ferromagnetic layer 22 magnetized leftward. Thus, the electrons are injected two times into layers with directions of magnetization different from each other. In Electron path 1, electrons with their spins polarized leftward by the s-d interaction in the second ferromagnetic layer 17 are injected into the thick magnetic domain wall displacement layer 12b and the third ferromagnetic layer 22, both being similarly magnetized leftward. Thus, the electrons are not subjected to so large scattering or reflection. Therefore, the electric resistance of Electron path 2 becomes higher than the electric resistance of Electron path 1. Consequently, by measuring the electric resistance across the electrodes, the state of internal magnetization of the element can be easily detected.

In the foregoing, the explanation related to an example of using the second electrode and the third electrode. However, also in the case in which the first electrode and the second electrode are used, the element can be similarly operated. Moreover, the electric resistance between the first electrode 15 and the second electrode 18 in the state shown in FIG. 2A differs from the electric resistance in the state shown in FIG. 3A in that the electric resistance in the state shown in FIG. 2A is larger than that in the state shown in FIG. 3A. By combining such electric resistances with the electric resistance between the second electrode 18 and the third electrode 23, multi-value recording is made possible.

The arrangement shown in FIG. 1 can be modified as necessary within the range without departing from the gist of the invention. For example, a spin injection magnetic domain wall displacement element 2 shown in FIG. 4 is an example of such modification in which each section of the exchange coupling control layer shown in FIG. 1 is formed with an exchange coupling control layer and a nonmagnetic metal layer. The section corresponding to the first exchange coupling control layer 13 in FIG. 1 is formed with a first exchange coupling control layer 13 and a first nonmagnetic metal layer 25, with which an antiferromagnetic coupling is provided between the first ferromagnetic layer 14 and the magnetic domain wall displacement layer 12a through the first exchange coupling control layer 13. The first nonmagnetic metal layer 25 ensures conductivity between the first ferromagnetic layer 14 and the magnetic domain wall displacement layer 12 and cuts off the magnetic coupling between the first ferromagnetic layer 14 and the magnetic domain wall displacement layer 12. Moreover, the section corresponding to the intermediate exchange coupling control layer 19 in FIG. 1 is formed with an intermediate exchange coupling control layer 19 and an intermediate nonmagnetic metal layer 26. The relation of the layer 19 and the layer 26 with the intermediate ferromagnetic layer 20 is the same as the relation of the first exchange coupling control layer 13 and the first nonmagnetic metal layer 25 with the first ferromagnetic layer 14. This makes each of the nonmagnetic metal layers ensure conductivity between each of the ferromagnetic layers and the magnetic domain wall displacement layer 12, and enables the magnetic domain wall 24 to displace to under each of the magnetic layer groups. FIG. 4 shows an example in which a magnetic domain wall 24 extends to under the first magnetic layer group 50. As a result, a choice of magnetic domain wall positions can be widened.

In the foregoing, the explanation related to a method of separately detecting two magnetized states, which method becomes effective particularly in a memory element. However, continuous detection of magnetized state is also possible. When electrons pass through a magnetic layer with the direction of magnetization different from the directions of electron spins, the electron spins continuously change until the directions of electron spins are aligned with the direction of magnetization of the magnetic layer. Namely, the degree of polarization of electron spins differs depending on the length along which the electrons pass, and the electric resistance in a magnetic layer into which the electrons are to be injected next is to change depending on the degree of polarization of electron spins. More specifically, depending on the position of the magnetic domain wall 24 in the magnetic domain wall displacement layer 12, the electric resistance from the first electrode 15 to the third electrode 23 changes continuously. Since the position of the magnetic domain wall 24 depends on the value of current flowing in the element, by detecting the electric resistance of the element, realization of detection of flowed current becomes possible. Moreover, stepwise classification of the change in electric resistance also enables multi-value recording of the electrical resistance.

The second embodiment according to the invention is an embodiment in which ferromagnetic coupling is provided between the third magnetic layer group 52 and the magnetic domain displacement layer 12. Specific explanations thereof will be given below. FIG. 5 is a view for explaining an example of the basic arrangement of the second embodiment of a spin injection magnetic domain wall displacement element according to the invention, which view is a schematic cross sectional view of a spin injection magnetic domain wall displacement element 3. On the substrate 10, the magnetic domain wall displacement layer 12 is formed, on the one end of which the first magnetic layer group 50 and the first electrode 15 are formed in this order. On the other end of the magnetic domain wall displacement layer 12, the third magnetic layer group 52 and the third electrode 23 are formed in this order. At a position between the first magnetic layer group 50 and the third magnetic layer group 52, the second magnetic layer group 51 and the second electrode 18 are formed in this order. In the first magnetic layer group 50, the first exchange coupling control layer 13 and the first ferromagnetic layer 14 are formed in this order. In the second magnetic layer group 51, the second nonmagnetic metal layer 16 and the second ferromagnetic layer 17 are formed in this order. In the third magnetic layer group 52, a third exchange coupling control layer 31 and a third ferromagnetic layer 32 are formed in this order.

FIGS. 6A and 6B are schematic cross sectional views for explaining the operation principle of the example of the arrangement of the element of the second embodiment according to the invention. In each of the magnetic layers in the element shown in FIG. 5, the direction of magnetization thereof is shown with an arrow. The magnetic domain wall displacement layer 12 is divided by a magnetic domain wall 24 into the magnetic domain wall displacement layer 12a on the first electrode 15 side and the magnetic domain wall displacement layer 12b on the third electrode 23 side. The arrangement shown in FIG. 5 is the minimum unit of the element and the necessary number of the elements disposed on the same substrate to form a desired device. Circuits and driving elements for driving the elements according to the invention can be also arranged on the same substrate.

The substrate 10, the first electrode 15, the first ferromagnetic layer 14, the first exchange coupling control layer 13, the second electrode 18, the second ferromagnetic layer 17, the second nonmagnetic metal layer 16, and the third electrode 23 are formed similarly to those in the previously described spin injection magnetic domain wall displacement layer 1. The magnetic domain wall displacement layer 12 differs in that the spin injection magnetic domain wall displacement element 1 in a method of controlling the magnetic domain wall displacement layer 12b is controlled from the third electrode 23 side. However, the material, the film thickness and the magnetic characteristic thereof are provided similarly to those of the spin injection magnetic domain wall displacement element 1. The third exchange coupling control layer 31 and the third ferromagnetic layer 32 are for providing ferromagnetic coupling between the third ferromagnetic layer 32 and the magnetic domain wall displacement layer 12b on the third electrode 23 side. By the ferromagnetic coupling thus provided, the direction of magnetization of the magnetic domain wall displacement layer 12b on the third electrode 23 side is fixed in the same direction as the direction of the magnetization of the third ferromagnetic layer 32.

The third exchange coupling control layer 31 is a nonmagnetic layer for separating the magnetic domain wall displacement layer 12 from the third ferromagnetic layer 32 with a specified clearance to control an exchange coupling constant in the exchange coupling between the magnetic domain wall displacement layer 12b on the third electrode 23 side and the third ferromagnetic layer 32. The material of the third exchange coupling control layer 31 is determined similarly to that for the first exchange coupling control layer 13. Moreover, the film thickness thereof is determined so that ferromagnetic coupling is provided between the magnetic domain wall displacement layer 12b on the third electrode 23 side and the third ferromagnetic layer 32. The material of the third ferromagnetic layer 32 can be selected as necessary from materials having ferromagnetism and materials similar to those for the first ferromagnetic layer 14 can be used. During the operation of the element, the magnetization of the third ferromagnetic layer 32 is preferably fixed in one direction. Thus, the third ferromagnetic layer 32 has preferably a high coercive force and a large film thickness. The coercive force is preferably from 2000 to 4000 Oe and the thickness is preferably from 50 nm to 200 nm. The area of each of the third exchange coupling control layer 31 and the third ferromagnetic layer 32 is preferably made equivalent to the area of the third electrode 23. Each of the layers on the substrate 10 can be formed by a known deposition method for which methods such as sputtering, CVD, and evaporation can be used.

The operation principle is the same as that of the spin injection magnetic domain displacement element 1. Writing is carried out on the basis that the magnetic domain wall 24 is made displaced to positions such as those shown in FIGS. 6A and 6B depending on the direction of current supplied between the first electrode 15 and the third electrode 23. When a sufficient amount of current flows from the first electrode 15 to the third electrode 23, the magnetized state becomes as that shown in FIG. 6A, in which the thickness of the magnetic domain wall displacement layer 12a on the first electrode 15 side can be made sufficiently smaller than the electron-spin relaxation length to be on the order of, for example, 20 nm. Conversely, when a sufficient amount of current flows from the third electrode 23 to the first electrode 15, the magnetized state becomes as that shown in FIG. 6B, in which the thickness of the magnetic domain wall displacement layer 12b on the third electrode 23 side can be made sufficiently smaller than the electron-spin relaxation length to be on the order of, for example, 20 nm. The magnetic domain wall 24 can be controlled so as to be in positions corresponding to those shown in FIGS. 2A and 2B.

Reading out is carried out on the basis that the electric resistance of the element is largely changed depending on whether the states of magnetization of the thick magnetic layers are in antiparallel or in parallel with each other and an influence of the magnetization of the thin magnetic layer between the thick magnetic layers on the electric resistance is small. A case of carrying out reading out by detecting electric resistance between the second electrode 18 and the third electrode 23 is taken as an example. In the case of the magnetized state shown in FIG. 6A, all of the directions of magnetization in the second ferromagnetic layer 17, the magnetic domain wall displacement layer 12b on the third electrode 23 side and the third ferromagnetic layer 32 as thick magnetic layers are the same. In comparison, in the case of the magnetized state shown in FIG. 6B, in the second ferromagnetic layer 17, the magnetic domain wall displacement layer 12a on the first electrode 15 side and the third ferromagnetic layer 32 are thick magnetic layers, and the directions of magnetization in the magnetic layers adjacent to each other are opposite to each other. Consequently, the electric resistance in the state shown in FIG. 6B becomes larger than the electric resistance in the state shown in FIG. 6A.

In the foregoing, the explanation related an example of using the second electrode and the third electrode. However, the first electrode and the second electrode can be used to similarly operate the element. Moreover, like in the first embodiment, multi-value recording is made possible.

FIG. 7 is a view for explaining an example of another arrangement of the second embodiment of a spin injection magnetic domain wall displacement element 4. Here, the third magnetic layer group 52 is formed of a third ferromagnetic layer 42. Layers other than the third magnetic layer group 52 can be formed similarly to those in the spin injection magnetic domain wall displacement element 3.

FIGS. 8A and 8B are schematic cross sectional views for explaining the operation principle of the example of the arrangement of the element 4 shown in FIG. 7. In each of the magnetic layers in the element 4, the direction of magnetization thereof is shown with an arrow. The magnetic domain wall displacement layer 12 is divided by the magnetic domain wall 24 into the magnetic domain wall displacement layer 12a on the first electrode 15 side and the magnetic domain wall displacement layer 12b on the third electrode 23 side. The third ferromagnetic layer 42 and the magnetic domain wall displacement layer 12 are in direct contact with each other to provide ferromagnetic coupling between the third ferromagnetic layer 42 and the magnetic domain wall displacement layer 12b on the third electrode 23 side, by which the direction of magnetization of the magnetic domain wall displacement layer 12b on the second electrode 23 side is fixed in the same direction as the direction of the magnetization of the third ferromagnetic layer 42.

The material of the third ferromagnetic layer 42 can be selected as necessary from materials having ferromagnetism and materials similar to those for the first ferromagnetic layer 14 can be used. During the operation of the element, the magnetization of the third ferromagnetic layer 42 is preferably fixed in one direction. Thus, the third ferromagnetic layer 42 has preferably a high coercive force and a large film thickness. The coercive force is preferably from 2000 to 4000 Oe and the thickness is preferably from 50 nm to 200 nm. The area of the third ferromagnetic layer 42 is preferably made equivalent to the area of the third electrode 23. Each of the layers on the substrate 10 can be formed by a known deposition method for which methods such as sputtering, CVD, and evaporation can be used.

The operation principle is the same as that of the spin injection magnetic domain displacement element 3. Writing is carried out on the basis that the magnetic domain wall 24 is displaced to positions such as those shown in FIGS. 8A and 8B depending on the direction of current supplied between the first electrode 15 and the third electrode 23. When a sufficient amount of current flows from the first electrode 15 to the third electrode 23, the magnetized state becomes as that shown in FIG. 8A, in which the thickness of the magnetic domain wall displacement layer 12a on the first electrode 15 side can be made sufficiently smaller than the electron-spin relaxation length to be on the order of, for example, 20 nm. Conversely, when a sufficient amount of current flows from the third electrode 23 to the first electrode 15, the magnetized state becomes as that shown in FIG. 8B, in which the thickness of the magnetic domain wall displacement layer 12b on the third electrode 23 side can be made sufficiently smaller than the electron-spin relaxation length to be on the order of, for example, 20 nm.

Reading out is carried out also similarly to that in the spin injection magnetic domain displacement element 3. A case of reading out by detecting the electric resistance between the second electrode 18 and the third electrode 23 is taken as an example. In the case of the magnetized state shown in FIG. 8A, all of the directions of magnetization in the second ferromagnetic layer 17, the magnetic domain wall displacement layer 12b on the third electrode 23 side and the third ferromagnetic layer 42 as thick magnetic layers are the same. In comparison, in the case of the magnetized state shown in FIG. 8B, in the second ferromagnetic layer 17, the magnetic domain wall displacement layer 12a on the first electrode 15 side and the third ferromagnetic layer 42 are thick magnetic layers, and the directions of magnetization in the magnetic layers adjacent to each other are opposite to each other. Consequently, the electric resistance in the state shown in FIG. 8B becomes larger than the electric resistance in the state shown in FIG. 8A.

Figure 9:
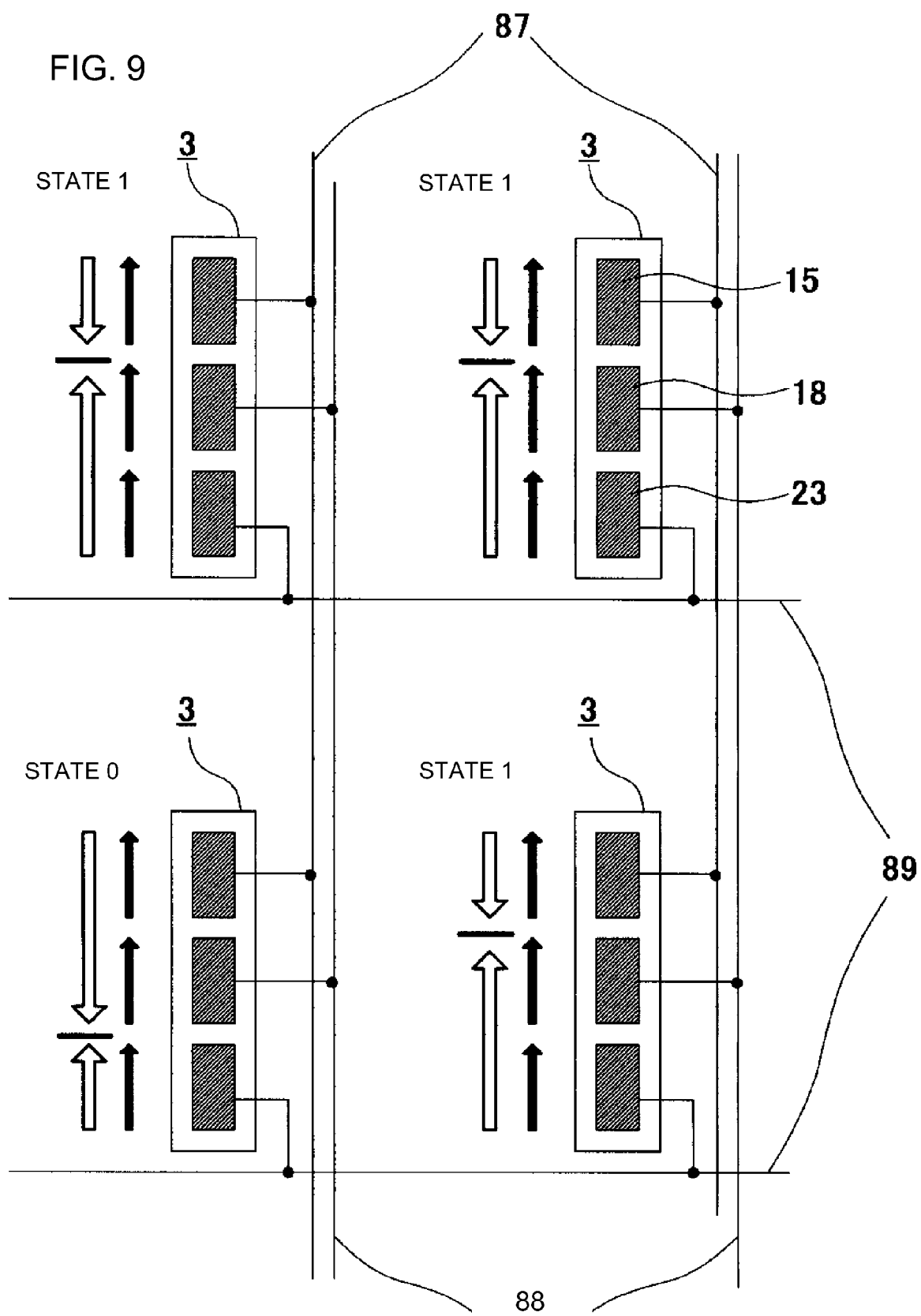
FIG. 9 is a schematic cross sectional view for explaining an example of an arrangement of a spin injection magnetic domain wall displacement device.
Figure 10:
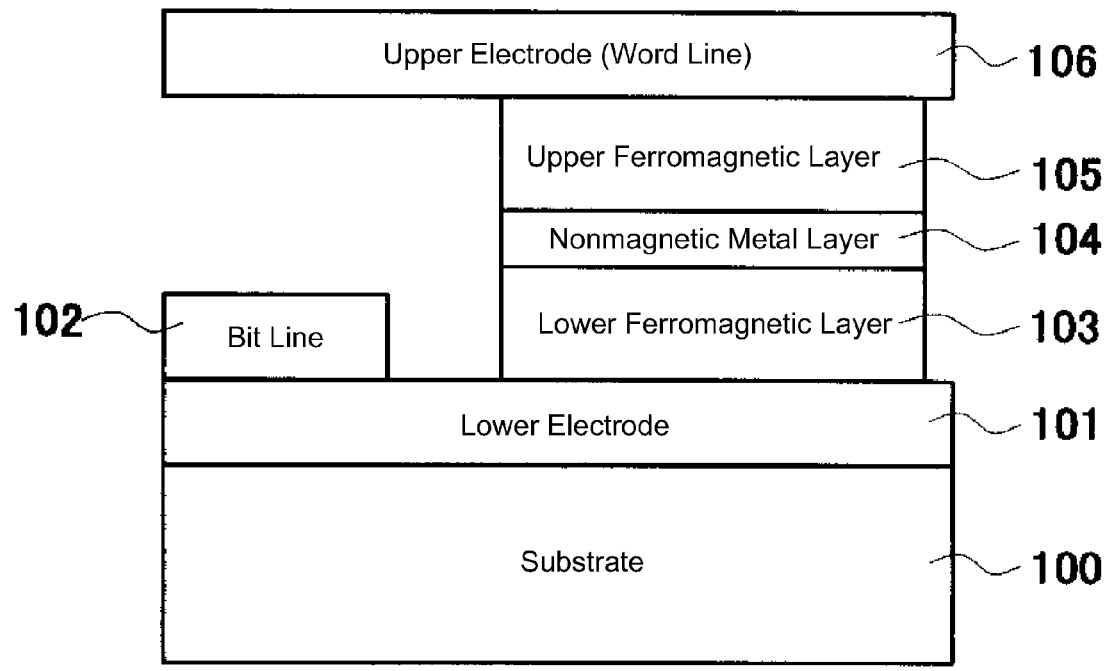
FIG. 10 is a schematic cross sectional view for explaining an example of an arrangement of a related GMR element.
Figure 11A:
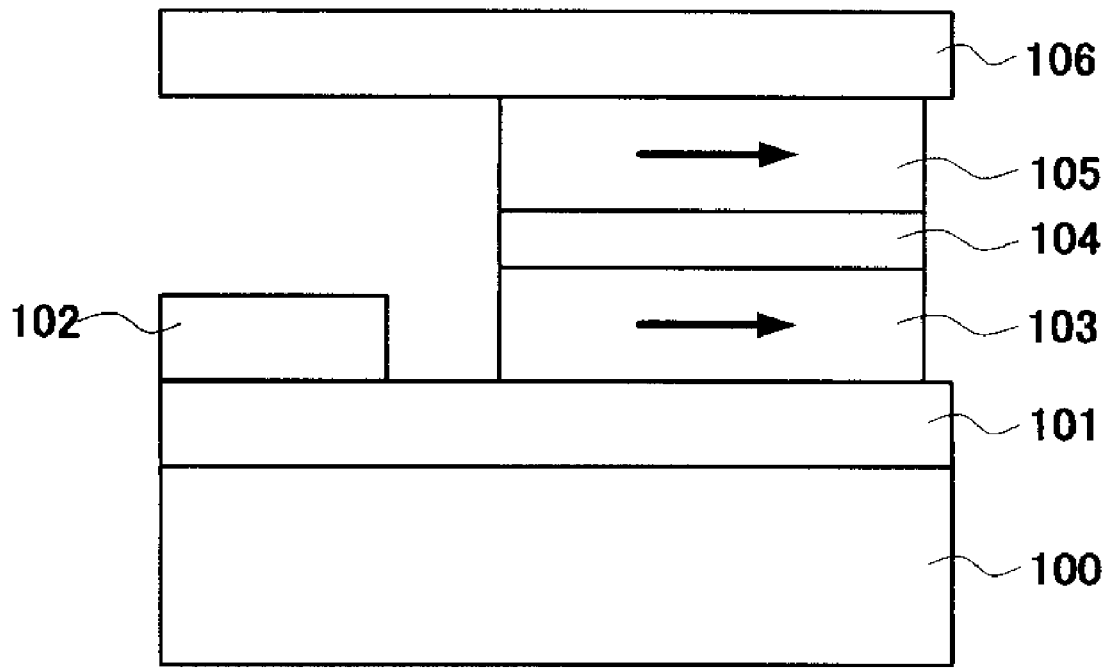
FIG. 11A illustrates the embodiment of FIG. 10 in the P-state for explaining the operation principle thereof.
Figure 11B:
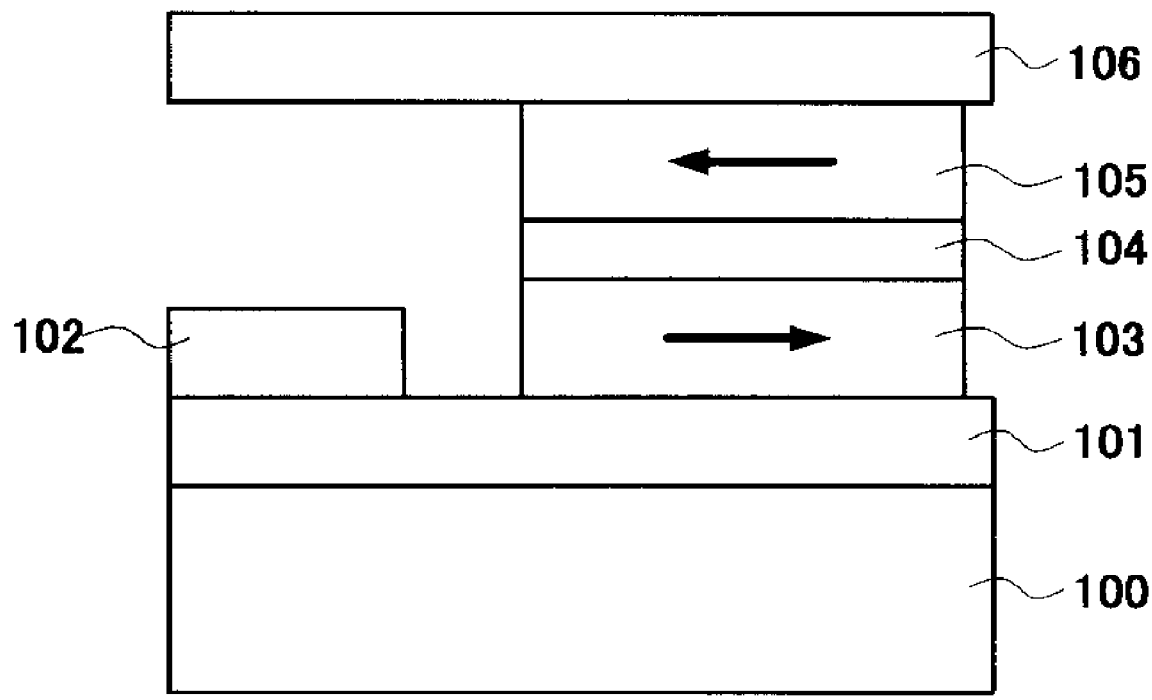
FIG. 11B illustrates the embodiment of FIG. 10 in the AP-state for explaining the operation principle thereof.
Figure 12:
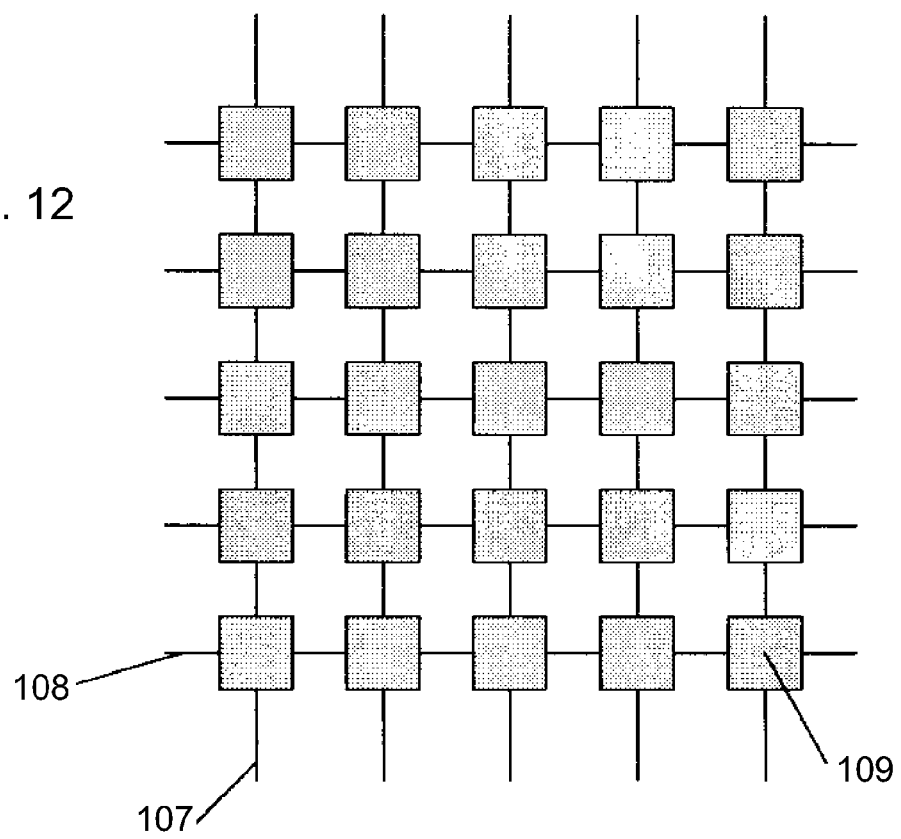
FIG. 12 is a schematic view showing a planar structure of an MRAM in which a plurality of GMR elements of FIG. 10 are connected.

A plurality of spin injection magnetic domain wall displacement elements can be connected to form a memory device. A specific explanation thereof will be given as follows. Referring to FIG. 9, which schematically illustrates an example of an arrangement of a memory device according to the invention, a plurality of spin injection magnetic domain wall displacement elements 3 are connected with word lines 87, data-reading-out lines 88 and bit lines 89. The word line 87 is connected to the first electrode 15 of each element 3, the data-reading-out line 88 is connected to the second electrode 18 of each element 3, and the bit line 89 is connected to the third electrode 23 of each element 3. Each of the arrows in the view represents the direction of magnetization in each magnetic layer. Non-shaded arrows indicate the directions of magnetization in the magnetic domain wall displacement layer 12 and shaded arrows indicate the directions of magnetization in the ferromagnetic layers 14, 17, and 32 disposed under the electrodes 15, 18, and 23, respectively. A thick solid line between the non-shaded arrows indicates the position of the magnetic domain wall 24 in the magnetic domain wall displacement layer 12. Moreover, "STATE 0" and "STATE 1" indicate that the electric resistances are in a high state and a low state, respectively.

The word lines 87 and the bit lines 89 are for carrying out recording into the elements. In carrying out recording, current flows between the first electrode 15 and the third electrode 23 in each of the elements to displace the magnetic domain wall 24. When a low driving current is desired, the displacement of the magnetic domain wall is preferably stopped in the vicinity of the end of the first electrode 15 or in the vicinity of the end of third electrode 23. When high thermal stability is desired, the magnetic domain wall 24 is further displaced to localize in the vicinity of each of the magnetic layer groups. When carrying out the multi-value recording with the above-explained method, the magnetic domain wall 24 is localized in the vicinity of each of the magnetic layer groups.

The data-reading-out line 88 is for detecting a state of magnetization of each of the elements, i.e., recorded data by flowing current between the second electrode 18 and the third electrode 23 or between the second electrode 18 and the first electrode 15 and detecting the electric resistance between the electrodes.

FIG. 9 illustrates the elements 3 in the initialized state with a magnetic field applied in the direction from below the paper surface (drawing) toward above. Furthermore, the element 3 at lower left is shown in a state in which recording has been carried out with current flowing from the third electrode 23 toward the first electrode 15. In the way as was explained above, a memory device can be formed into which a number of the elements are integrated.

In the following, more detailed explanations will be made with specific examples of the invention. In Example 1, the element with the arrangement shown in FIG. 1 was fabricated and operated. For the substrate 10, a silicon substrate with a thickness of 500 μm with a 500 nm thick oxide film formed thereon was used, on which the following layers were formed by using sputtering. The magnetic domain wall displacement layer 12 of $Ni_{80}Fe_{20}$ was formed with a thickness of 100 nm, a width of 200 nm, a length of 1000 nm and a coercive force of 5 Oe. At one end of the magnetic domain wall displacement layer 12, the first magnetic layer group 50 was formed. The first exchange coupling control layer 13 of Ru was formed with a thickness of 0.8 nm and an area of 100 nm×100 nm. Then, the first ferromagnetic layer 14 of a CoPt alloy was formed with a thickness of 200 nm, an area of 100 nm×100 nm, and a coercive force of 2500 Oe. The first electrode 15 of Au was formed with a thickness of 200 nm and an area of 100 nm×100 nm. On the central section of the magnetic domain wall displacement layer 12, the second magnetic layer group 51 was formed. The second nonmagnetic metal layer 16 of Cu was formed with a thickness of 1 nm and an area of 100 nm×100 nm. Then, the second ferromagnetic layer 17 of a CoPt alloy was formed with a thickness of 200 nm, an area of 100 nm×100 nm, and a coercive force of 2500 Oe. The second electrode 18 of Au was formed with a thickness of 200 nm and an area of 100 nm×100 nm. At the other end of the magnetic domain wall displacement layer 12, the third magnetic layer group 52 was formed. The intermediate exchange coupling control layer 19 of Ru was formed with a thickness of 0.8 nm and an area of 100 nm×100 nm. The intermediate ferromagnetic layer 20 of $Ni_{45}Fe_{55}$ was formed with a thickness of 15 nm, an area of 100 nm×100 nm and a coercive force of 10 Oe. The third exchange coupling control layer 21 of Ru was formed with a thickness of 0.8 nm and an area of 100 nm×100 nm. The third ferromagnetic layer 22 of a CoPt alloy was formed with a thickness of 200 nm, an area of 100 nm×100 nm and a coercive force of 2500 Oe. Then, the third electrode 23 of Au was formed with a thickness of 200 nm and an area of 100 nm×100 nm to provide Example 1.

By using Example 1, an evaluation was carried out with the following procedures. At the beginning, a magnetic field of 5000 Oe was applied to initialize the element into the state shown in FIG. 3A. As Procedure 1, a driving current of 10 mA (with a current density of $1\times10^8$ A/cm$^2$) was made to flow from the third electrode 23 toward the first electrode 15 to bring the element into the state shown in FIG. 3B. Then, the electric resistance between the second electrode 18 and the third electrode 23 was measured at this time with a detecting current at 300 μA. Next, as Procedure 2, a driving current of 10 mA (with a current density of $1\times10^8$ A/cm$^2$) was made to flow from the first electrode 15 toward the third electrode 23 to bring the element into the state shown in FIG. 3A. Then, the electric resistance between the second electrode 18 and the third electrode 23 measured at this time with a detecting current at 300 μA. With the direction of current alternately reversed, each of Procedures 1 and 2 was carried out ten times, by which an average of the electric resistance values in each Procedure was obtained. The average of electric resistance value in the state shown in FIG. 3A was 1.4Ω and the average of electric resistance value in the state shown in FIG. 3B was 1.6Ω. Stable measured values were obtained in each of the procedures, by which the memory operation of the element can be confirmed.

In Example 2, the element with the arrangement shown in FIG. 5 was fabricated and operated. The spin injection magnetic domain wall displacement element 3 was fabricated like in Example 1 except that the third magnetic layer group 52 was fabricated as follows. On the magnetic domain wall displacement layer 12, the third exchange coupling control layer 31 of Ru was formed with a thickness of 1.8 nm and an area of 100 nm×100 nm. Then, the third ferromagnetic layer 32 of a CoPt alloy was formed with a thickness of 200 nm, an area of 100 nm×100 nm and a coercive force of 2500 Oe. The third electrode 23 of Au was formed with a thickness of 200 nm and an area of 100 nm×100 nm to provide Example 2.

By using Example 2, an evaluation was carried out similarly to that for Example 1. With the magnetic field strength for initialization given at 5000 Oe, the current density of the driving current given at $1\times10^8$ A/cm$^2$ and the detecting current given at 300 μA, the electric resistance value in each of Procedures 1 and 2 was measured ten times. The average of electric resistance value in the state shown in FIG. 6A was 1.4Ω and the average of electric resistance value in the state shown in FIG. 6B was 1.6Ω. Stable measured values were obtained in each of the Procedures, by which the memory operation of the element can be confirmed.

In Example 3, the element with the arrangement shown in FIG. 7 was fabricated and operated. The spin injection magnetic domain wall displacement element 4 was fabricated like in example 1 except that the third magnetic layer group 52 was fabricated as follows. On the magnetic domain wall displacement layer 12, the third ferromagnetic layer 42 of a CoPt alloy was formed with a thickness of 200 nm, an area of 100 nm×100 nm and a coercive force of 2500 Oe. Then, the third electrode 23 of Au was formed with a thickness of 200 nm and an area of 100 nm×100 nm to provide Example 3.

By using Example 3, an evaluation was carried out similarly to that for Example 1. With the magnetic field strength for initialization given at 5000 Oe, the current density of the driving current given at $1\times10^8$ A/cm$^2$ and the detecting current given at 300 μA, the electric resistance value in each of Procedures 1 and 2 was measured ten times. The average of electric resistance value in the state shown in FIG. 8A was 1.4Ω and the average of electric resistance value in the state shown in FIG. 8B was 1.6Ω. Stable measured values were obtained in each of the procedures, by which the memory operation of the element can be confirmed.

By arranging ferromagnetic layers, each with a large coercive force, outside a magnetic domain wall displacement layer and providing a ferromagnetic or antiferromagnetic coupling between the ferromagnetic layer and the magnetic domain wall displacement layer, it became feasible to record and reproduce a position of a magnetic domain wall as a change in the electric resistance.

Furthermore, by providing the ferromagnetic or antiferromagnetic coupling between a ferromagnetic layer and the magnetic domain wall displacement layer, it became possible to stabilize the magnetic domain wall and the position of the magnetic domain wall. As a result, even though the volume or the saturation magnetization of the magnetic domain wall displacement layer is brought to be small for displacing the magnetic domain wall in the magnetic domain wall displacement layer at a high speed and at a low current, it is possible to ensure thermal stability of the recorded magnetic domain wall. This enabled realization of high speed operation, operating current reduction, and thermal stability in recording magnetization of the element with compatibility among them being assured.

A large number of the elements can be integrated on a substrate, on which silicon semiconductor CMOS circuits are integrated, while being combined with the circuits to realize a magnetic random access memory having a large recording capacity and including no mechanical driving sections. In addition, the element according to the invention exhibits magnetoresistance effect that changes the state of magnetization in the element depending on the direction of current flowing between terminals to change the electric resistance between the terminals. Thus, the element can be also used as a weak current sensor.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-122223, filed on 20 Apr. 2005. The disclosure of the priority application, in its entirety, including the drawings, claims, and the specification thereof, is incorporated herein by reference.

What is claimed is:

1. A spin injection magnetic domain wall displacement element comprising:
    a magnetic domain wall displacement layer having a magnetic domain wall;
    a first magnetic layer group having a first ferromagnetic layer;
    a second magnetic layer group having a second ferromagnetic layer; and
    a third magnetic layer group having a third ferromagnetic layer,
    wherein the first magnetic layer group, the second magnetic layer group, and the third magnetic layer group are disposed in this order on one side of the magnetic domain wall displacement layer,
    wherein the magnetic domain wall in the magnetic domain wall displacement layer is displaceable by flowing electrons between the first magnetic layer group and the third magnetic layer group, and
    wherein the position of the magnetic domain wall in the magnetic domain wall displacement layer is detectable by the difference in the electrical resistance of a region between the second magnetic layer group and the first or third magnetic layer group.

2. The spin injection magnetic domain wall displacement element according to claim 1, wherein:
    at least part of the magnetic domain wall displacement layer is in contact with the first magnetic layer group and is in antiferromagnetic coupling with part of the first magnetic layer group, and
    at least part of the magnetic domain wall displacement layer is in contact with the third magnetic layer group and is in antiferromagnetic or ferromagnetic coupling with part of the third magnetic layer group.

3. The spin injection magnetic domain wall displacement element according to claim 2, wherein:
the first magnetic layer group comprises a nonmagnetic first exchange coupling control layer and the first ferromagnetic layer laminated together, and
the first exchange coupling control layer is in contact with the magnetic domain wall displacement layer.

4. The spin injection magnetic domain wall displacement element according to claim 2, wherein:
the second magnetic layer group comprises a second nonmagnetic metal layer and the second ferromagnetic layer laminated together, and
the second nonmagnetic metal layer is in contact with the magnetic domain wall displacement layer.

5. The spin injection magnetic domain wall displacement element according to claim 3, wherein:
the second magnetic layer group comprises a second nonmagnetic metal layer and the second ferromagnetic layer laminated together, and
the second nonmagnetic metal layer is in contact with the magnetic domain wall displacement layer.

6. The spin injection magnetic domain wall displacement element according to claim 3, wherein:
the third magnetic layer group comprises a nonmagnetic intermediate exchange coupling control layer, an intermediate ferromagnetic layer, a nonmagnetic third exchange coupling control layer, and the third ferromagnetic layer laminated together in this order, and
the intermediate exchange coupling control layer is in contact with the magnetic domain wall displacement layer.

7. The spin injection magnetic domain wall displacement element according to claim 3, wherein:
the third magnetic layer group comprises a nonmagnetic intermediate exchange coupling control layer, an intermediate ferromagnetic layer, a nonmagnetic third exchange coupling control layer, and the third ferromagnetic layer laminated together in this order, and
the intermediate exchange coupling control layer is in contact with the magnetic domain wall displacement layer.

8. The spin injection magnetic domain wall displacement element according to claim 4, wherein:
the third magnetic layer group comprises a nonmagnetic intermediate exchange coupling control layer, an intermediate ferromagnetic layer, a nonmagnetic third exchange coupling control layer, and the third ferromagnetic layer laminated together in this order, and
the intermediate exchange coupling control layer is in contact with the magnetic domain wall displacement layer.

9. The spin injection magnetic domain wall displacement element according to claim 5, wherein:
the third magnetic layer group comprises a nonmagnetic intermediate exchange coupling control layer, an intermediate ferromagnetic layer, a nonmagnetic third exchange coupling control layer, and the third ferromagnetic layer laminated together in this order, and
the intermediate exchange coupling control layer is in contact with the magnetic domain wall displacement layer.

10. The spin injection magnetic domain wall displacement element according to claim 6, wherein the film thickness of the intermediate ferromagnetic layer is smaller than the spin relaxation length of electrons in the intermediate ferromagnetic layer.

11. The spin injection magnetic domain wall displacement element according to claim 7, wherein the film thickness of the intermediate ferromagnetic layer is smaller than the spin relaxation length of electrons in the intermediate ferromagnetic layer.

12. The spin injection magnetic domain wall displacement element according to claim 8, wherein the film thickness of the intermediate ferromagnetic layer is smaller than the spin relaxation length of electrons in the intermediate ferromagnetic layer.

13. The spin injection magnetic domain wall displacement element according to claim 9, wherein the film thickness of the intermediate ferromagnetic layer is smaller than the spin relaxation length of electrons in the intermediate ferromagnetic layer.

14. The spin injection magnetic domain wall displacement element according to claim 2, wherein:
the third magnetic layer group comprises a nonmagnetic third exchange coupling control layer and the third ferromagnetic layer laminated together, and
the third exchange coupling control layer is in contact with the magnetic domain wall displacement layer.

15. The spin injection magnetic domain wall displacement element according to claim 3, wherein:
the third magnetic layer group comprises a nonmagnetic third exchange coupling control layer and the third ferromagnetic layer laminated together, and
the third exchange coupling control layer is in contact with the magnetic domain wall displacement layer.

16. The spin injection magnetic domain wall displacement element according to claim 4, wherein:
the third magnetic layer group comprises a nonmagnetic third exchange coupling control layer and the third ferromagnetic layer laminated together, and
the third exchange coupling control layer is in contact with the magnetic domain wall displacement layer.

17. The spin injection magnetic domain wall displacement element according to claim 5, wherein:
the third magnetic layer group comprises a nonmagnetic third exchange coupling control layer and the third ferromagnetic layer laminated together, and
the third exchange coupling control layer is in contact with the magnetic domain wall displacement layer.

18. A spin injection magnetic domain wall displacement device comprising:
a plurality of the spin injection magnetic domain wall displacement elements, each element comprising:
a magnetic domain wall displacement layer having a magnetic domain wall;
a first magnetic layer group having a first ferromagnetic layer;
a second magnetic layer group having a second ferromagnetic layer; and
a third magnetic layer group having a third ferromagnetic layer,
wherein the first magnetic layer group, the second magnetic layer group, and the third magnetic layer group are disposed in this order on one side of the magnetic domain wall displacement layer,
wherein the magnetic domain wall in the magnetic domain wall displacement layer is displaceable by flowing electrons between the first magnetic layer group and the third magnetic layer group, and
wherein the position of the magnetic domain wall in the magnetic domain wall displacement layer is detectable by the difference in the electrical resistance of a region between the second magnetic layer group and the first or third magnetic layer group, and wherein the spin injection magnetic domain wall displacement elements are coupled with one another with the first magnetic layer groups thereof connected to one of a group of word or bit lines, with the third magnetic layer groups thereof connected to the other of a group of the word or bit lines, and with the second magnetic layer groups thereof connected to data read-out lines.

19. The spin injection magnetic domain wall displacement device according to claim 18, wherein the device carries out recording and reading based on the difference in the electric resistance of a region between the second and first or third magnetic layer groups.

20. The spin injection magnetic domain wall displacement device according to claim 19, wherein:
  at least part of the magnetic domain wall displacement layer is in contact with the first magnetic layer group and is in antiferromagnetic coupling with part of the first magnetic layer group in each of the elements, and
  at least part of the magnetic domain wall displacement layer is in contact with the third magnetic layer group and is in antiferromagnetic or ferromagnetic coupling with part of the third magnetic layer group in each of the elements.

* * * * *